(12) United States Patent
Izumi

(10) Patent No.: US 7,211,880 B2
(45) Date of Patent: May 1, 2007

(54) PHOTOELECTRIC CONVERSION APPARATUS AND MANUFACTURING METHOD OF SAME

(75) Inventor: Yoshihiro Izumi, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 73 days.

(21) Appl. No.: 10/516,091

(22) PCT Filed: Jul. 7, 2003

(86) PCT No.: PCT/JP03/08628

§ 371 (c)(1),
(2), (4) Date: Nov. 30, 2004

(87) PCT Pub. No.: WO2004/027874

PCT Pub. Date: Apr. 1, 2004

(65) Prior Publication Data

US 2005/0161754 A1   Jul. 28, 2005

(30) Foreign Application Priority Data

Aug. 30, 2002  (JP) .............................. 2002-255474
May 19, 2003  (JP) .............................. 2003-140388

(51) Int. Cl.
*H01L 23/02*   (2006.01)
*H01L 21/00*   (2006.01)

(52) U.S. Cl. ..................... 257/678; 438/106; 438/25; 257/670; 257/671; 257/E23.01

(58) Field of Classification Search ................. 438/106, 438/25; 257/678, 670, 671, E23.01
See application file for complete search history.

(56) References Cited

U.S. PATENT DOCUMENTS 6,608,312 B1 * 8/2003 Okada et al. .......... 250/370.11

FOREIGN PATENT DOCUMENTS

JP    61-196571 A    8/1986

(Continued)

OTHER PUBLICATIONS

International Search Report mailed Oct. 21, 2003 in corresponding PCT application PCT/JP03/008628.

(Continued)

*Primary Examiner*—Walter Lindsay, Jr.
(74) *Attorney, Agent, or Firm*—Nixon & Vanderhye P.C.

(57) ABSTRACT

An image reading apparatus (10) includes a photoelectric conversion element formation substrate (4) having a plurality of photoelectric conversion elements (2) on a reverse surface of an information reading surface, and a supporting substrate (1) bonded by an adhesive resin (5) to the photoelectric conversion element formation substrate (4) so that the supporting substrate (1) is integrated with the photoelectric conversion element formation substrate (4) and faces the plurality of photoelectric conversion elements (2) on the photoelectric conversion element formation substrate (4). With this arrangement, provided is a photoelectric conversion apparatus and manufacturing method of same in which (a) a process of bonding a micro glass sheet is not required and (b) a protrusion of an installation portion toward a surface of a document is eliminated.

26 Claims, 13 Drawing Sheets

FOREIGN PATENT DOCUMENTS

| | | |
|---|---|---|
| JP | 2-8055 U | 1/1990 |
| JP | 2-54964 A | 2/1990 |
| JP | 5-243547 A | 9/1993 |
| JP | 6-350070 A | 12/1994 |
| JP | 8-8414 A | 1/1996 |
| JP | 10-333605 A | 12/1998 |
| JP | 11-40791 A | 2/1999 |
| JP | 2000-269475 A | 9/2000 |

OTHER PUBLICATIONS

International Preliminary Examination Report mailed Jun. 25, 2004 in corresponding PCT Application No. PCT/JP03/008628.

Matsumoto, "Liquid Crystal Display Technologies: Active Matrix LCD" with partial English translation thereof, Sangyo Tosho Kabushiki Kaisha, Nov. 8, 1996, pp. 105-107.

* cited by examiner

D1, D2, ..., Dm : SOURCE LINE
G1, G2, ..., Gn : GATE LINE

PHOTOELECTRIC CONVERSION APPARATUS AND MANUFACTURING METHOD OF SAME

This application is the US national phase of international application PCT/JP2003/008628 filed on 7 Jul. 2003, which designated the US and claims priority of JP Application No. 2002-255474 filed 30 Aug. 2002 and JP Application No. 2003-140388 filed 19 May 2003. The entire contents of these applications are incorporated herein by reference.

TECHNICAL FIELD

The present invention relates to a photoelectric conversion apparatus capable of reading information of documents, photographs, business cards and the like, and relates to a manufacturing method of same.

BACKGROUND ART

There has been conventionally known image sensors that are close-touching-type photoelectric conversion apparatuses in which large numbers of photoelectric conversion means (e.g. photodiodes, phototransistors) and switching elements (e.g. thin film transistors) are disposed in a line or two dimensionally in lines.

Examples of such image sensors are active-matrix-type image reading apparatuses disclosed in Japanese Publication for unexamined Utility model, No. 2-8055/1990 (Jitsukaihei; publication date: Jan. 18, 1990) and in Japanese Publication for Unexamined Patent Application, No. 5-243547/1993 (Tokukaihei; publication date: Sep. 21, 1993).

As shown in FIG. 14, in the active-matrix-type image reading apparatus, each pixel 81 of active matrix array, in which pixels are arrayed in an X-Y matrix, has an optical-sensor-use TFT (Thin Film Transistor) 82 and a switching-use TFT 83. The optical-sensor-use TFT 82 is a photoelectric conversion element, and the switching-use TFT 83 is a switching element. The optical-sensor-use TFT 82 of each pixel 81 is so designed that electric properties thereof are changed in accordance with whether a photogenic subject, such as a surface of a document, is white or black (bright or dark).

Specifically, because a resistance value of a phototransistor, which is used as the optical-sensor-use TFT 82, is changed in accordance with brightness (bright or dark) of light, an amount of electrical charge in an image capacitor (charge capacitor) connected to the phototransistor, or a voltage applied to each pixel 81 is changed. Therefore, two-dimensional information of the photogenic subject can be obtained by sequentially reading out an electrical charge distribution or a voltage distribution of the image capacitor by using the switching-use TFT 83.

For example, as disclosed in Japanese Publication for Unexamined Patent Application, No. 6-350070/1994 (Tokukaihei; publication date: Dec. 22, 1994), in a close-touching-type photoelectric conversion apparatus, it is necessary, regardless of whether a close-touching-type photoelectric conversion apparatus is one-dimensional line-sensor-use photoelectric conversion apparatus or two-dimensional area-sensor-use photoelectric conversion apparatus, to form a transparent protective layer over photoelectric conversion means, such as thin film phototransistors, photodiodes, or photoconductors, after the photoelectric conversion means is formed on a substrate.

The protective layer is provided for protecting the photoelectric conversion means including semiconductor elements.

Specifically, as shown in FIG. 15, a photoelectric conversion element formation substrate 92, on which photoelectric conversion elements 91 are provided, and a protective layer 93 made of a thin glass substrate, such as a micro glass sheet, are bonded together by using an adhesive resin 94.

In this case, a light source 95, which functions as a backlight, is positioned under the photoelectric conversion element formation substrate 92, on which the photoelectric conversion elements 91 are provided. A document to be read is placed on the protective layer 93. Light emitted from the light source 95 passes through an opening section (transparent section) of the photoelectric conversion apparatus, and is radiated onto the document. The light radiated onto the document is reflected by a surface of the document, and enters into the photoelectric conversion elements 91.

However, the conventional photoelectric conversion apparatuses and manufacturing methods of same have the following problems.

(1) In a case where a high-definition photoelectric conversion apparatus is needed, a thickness of the protective layer (micro glass sheet) must be reduced. For example, in a case of a photoelectric conversion apparatus having a pixel density of 300 dpi, a pixel pitch is approximately 85 μm. In this case, it is necessary to set the thickness of the protective layer to approximately 50 μm, which is thinner than the pixel pitch. Otherwise, inter-pixel crosstalk of the light reflected by the document becomes so significant as to blur an image. In a case where the pixel density is 500 dpi, the pixel pitch is approximately 50 μm. In this case, the thickness of the protective layer must be reduced further, to approximately 30 μm.

If the thin protective layer is made of micro glass sheet, as in conventional arrangements, it is difficult to evenly bond the protective layer, by using the adhesive resin, to the substrate on which the photoelectric conversion elements have been formed. This is because the micro glass sheet is difficult to handle due to fragileness, and can easily be distorted. Therefore, such an arrangement and manufacturing method of the photoelectric conversion apparatus are needed that do not require a process of bonding the micro glass sheet.

(2) To the substrate on which the photoelectric conversion elements are provided, also provided are large numbers of switching elements and the like disposed in matrix or in a line. Therefore, it is necessary to install, in a peripheral portion (edge portion) of the substrate, a driving LSI (Large Scale Integrated Circuit) for driving the switching elements, a reading LSI for reading electric information obtained from the photoelectric conversion elements, and/or a flexible printed circuit (FPC), for example.

In installing the LSIs in the peripheral portion of the substrate, a COG (Chip On Glass) method or a TCP (Tape Carrier Package) method is employed, for example. In the COG method, an LSI chip is directly installed on a substrate. In the TCP method, an LSI is installed to a tape, and the tape is installed on a substrate. In a case where the LSIs are installed by the COG method or the TCP method, or in a case where the FPC (Flexible Printed Circuit) is installed, it is necessary to provide a cover for protecting an installation portion, that is, the portion where the LSIs are installed. As a result, the installation portion in the peripheral portion of the substrate inevitably protrudes toward a surface of the document as compared with the protective layer provided to an image-pickup region.

In a case where close-touching-type photoelectric conversion elements are used, it is necessary to cause the document-to be in close contact with the protective layer, so as to read the image. If the document has a large size, however, the document is hindered from closely touching the protective layer because of the protrusion of the installation portion. This causes problems of distortion and blur in an input image. Therefore, such an arrangement and manufacturing method of the photoelectric conversion apparatus are needed in which the installation portion of the LSIs and the FPC on a document-image-pickup plane, that is, on a surface on which the protective layer is provided, is eliminated.

The present invention is made in light of the problems above. An object of the present invention is to provide a photoelectric conversion apparatus and manufacturing method of same in which (a) the process of bonding the micro glass sheet is not required and (b) the protrusion of the installation portion toward the surface of the document is eliminated.

DISCLOSURE OF INVENTION

To solve the problems above, the present invention provides a display apparatus including: a photoelectric conversion element formation substrate having, on a photoelectric conversion element formation surface thereof, a plurality of photoelectric conversion elements, the photoelectric conversion element formation surface being a reverse surface of an information reading surface; and a supporting substrate bonded by an adhesive material to the photoelectric conversion element formation substrate so that the supporting substrate is integrated with the photoelectric conversion element formation substrate and faces the plurality of photoelectric conversion elements on the photoelectric conversion element formation substrate.

In this invention, the photoelectric conversion element formation substrate has the plurality of photoelectric conversion elements formed thereon, and the supporting substrate is bonded by the adhesive material to the photoelectric conversion element formation substrate so that the supporting substrate is integrated with the photoelectric conversion element formation substrate and faces the plurality of photoelectric conversion elements on the photoelectric conversion element formation substrate.

In this arrangement, therefore, the information reading surface is a reverse surface of the photoelectric conversion element formation surface, and the photoelectric conversion element formation substrate also functions as a protective substrate for protecting the photoelectric conversion elements from touching the document.

By adopting this arrangement, it is no longer necessary to additionally provide a micro glass sheet, which has a protective effect, and to bond the micro glass sheet to the photoelectric conversion element formation substrate, unlike in the conventional arrangements.

As a result, it is possible to provide a photoelectric conversion apparatus that does not require the process of bonding the micro glass sheet as a protective substrate.

Moreover, in the photoelectric conversion apparatus of the present invention having the same arrangement, the supporting substrate is thicker than the photoelectric conversion element formation substrate.

With this arrangement, it is possible to structurally reinforce the photoelectric conversion element formation substrate by the supporting substrate, even if the photoelectric conversion element formation substrate is thin.

Moreover, the photoelectric conversion apparatus of the present invention further includes: a display medium between the photoelectric conversion element formation substrate and the supporting substrate; and an active element on the photoelectric conversion element formation surface, for driving the display medium.

In this arrangement, the display medium is provided between the photoelectric conversion element formation substrate and the supporting substrate, and the display medium is driven by the active element. As a result, it is possible to realize a photoelectric conversion apparatus capable of reading (inputting) and displaying (outputting) an image by-using a single screen.

To solve the problems above, the present invention provides a manufacturing method of a photoelectric conversion apparatus for reading information, including the steps of: installing, on a reverse surface of an information reading surface of a first substrate, (a) a plurality of photoelectric conversion elements and (b) a semiconductor integrated circuit (IC: Integrated Circuit), which is necessary for driving the plurality of photoelectric conversion elements; bonding a second substrate by an adhesive material to the first substrate so that the second substrate covers the plurality of photoelectric conversion elements on the reverse surface of the information reading surface; and processing the information reading surface of the first substrate by etching or grinding so as to reduce a thickness of the first substrate.

In this invention, first, in the step of installing, installed on the reverse surface of the information reading surface of the first substrate are (a) the plurality of photoelectric conversion elements and (b) the semiconductor integrated circuit (IC), which is necessary for driving the plurality of photoelectric conversion elements. Next, in the steps of bonding, the second substrate is bonded by the adhesive material to the first substrate so that the second substrate covers the plurality of photoelectric conversion elements on the reverse surface of the information reading surface. Thereafter, in the step of processing, the information reading surface of the first substrate is processed by etching or grinding so as to reduce the thickness of the first substrate.

With this arrangement, the step of bonding a micro glass sheet as a protective substrate, which is conventionally required, is no longer necessary. As a result, it is easy to manufacture the photoelectric conversion apparatus.

Conventionally, a thin micro glass sheet is bonded as a protective substrate. Therefore, one problem in handling the thin micro glass sheet is that the thin micro glass sheet is often damaged.

In contrast, in the present invention, the reverse surface of the photoelectric conversion element formation surface is ground after the photoelectric conversion elements are formed on the photoelectric conversion element formation surface, instead of bonding the micro glass sheet as a protective substrate. In this way, a problem of damage to the protective substrate is avoided. As a result, it is possible to prevent a yield of products from being lowered.

Therefore, it is possible to provide a manufacturing method of a photoelectric conversion apparatus that does not require the process of bonding the micro glass sheet and that is capable of preventing the yield of products from being lowered.

Moreover, in the present invention, not only the plurality of photoelectric conversion elements, but also the semiconductor integrated circuit (IC), which is necessary for driving the photoelectric conversion elements, is installed in the step of installing. Therefore, the semiconductor integrated circuit (IC) is formed on the reverse surface of the information reading surface. As a result, the information reading surface is a flat and smooth surface of the photoelectric conversion element formation substrate, and the protrusion of the installation portion of the semiconductor integrated circuit (IC), the TCP, and/or the FPC, for example, which has conventionally existed, is eliminated.

As a result, it is possible to provide a manufacturing method of a photoelectric conversion apparatus in which the protrusion of the installation portion toward the surface of the document is eliminated.

To attain the object above, the present invention provides a manufacturing method of a photoelectric conversion apparatus for reading information, including the steps of: installing, on a reverse surface of an information reading surface of a first substrate, (a) a plurality of photoelectric conversion elements and (b) a TCP (Tape Carrier Package) and/or an FPC (Flexible Printed Circuit), which is necessary for driving the plurality of photoelectric conversion elements; bonding a second substrate by an adhesive material to the first substrate so that the second substrate covers the plurality of photoelectric conversion elements on the reverse surface of the information reading surface; and processing the information reading surface of the first substrate by etching or grinding so as to reduce a thickness of the first substrate.

With this invention, it is possible to provide a manufacturing method of a photoelectric conversion apparatus that does not require the process of bonding the micro glass sheet and that is capable of preventing the yield of products from being lowered.

In the present invention, not only the plurality of photoelectric conversion elements, but also the TCP and/or the FPC, which is necessary for driving the plurality of photoelectric conversion elements, is installed in the step of installing on the reverse surface of the information reading surface of the first substrate.

Therefore, the TCP and/or the FPC is formed on the reverse surface of the information reading surface. As a result, the information reading surface is a flat and smooth surface of the photoelectric conversion element formation substrate, and the protrusion of the installation portion of the TCP, and/or the FPC, for example, which has conventionally existed, is eliminated.

As a result, it is possible to provide a manufacturing method of a photoelectric conversion apparatus in which the protrusion of the installation portion toward the surface of the document is eliminated.

For a fuller understanding of the nature and advantages of the invention, reference should be made to the ensuing detailed description taken in conjunction with the accompanying drawings.

BRIEF DESCRIPTION OF DRAWINGS

FIG. 2(*b*) is a cross-sectional view illustrating a step of bonding a facing supporting substrate (second substrate) by an adhesive agent. FIG. 2(*c*) is a cross-sectional view illustrating a step of etching back the glass substrate (first substrate) so as to produce the glass substrate into a micro glass sheet protective film. FIG. 2(*d*) is a cross-sectional view illustrating where a light source is installed so as to read a document.

FIG. 6(*b*) is a cross-sectional view illustrating a step of bonding a facing supporting substrate (second substrate) by an adhesive agent. FIG. 6(*c*) is a cross-sectional view illustrating a step of etching back the glass substrate (first substrate) so as to produce the glass substrate into a micro glass sheet protective film. FIG. 6(*d*) is a cross-sectional view illustrating a step of installing a light source.

Showing an image reading apparatus in yet another embodiment of the present invention, FIG. 7(*a*) is a cross-sectional view in illustrating a step of forming array of switching elements and photoelectric conversion elements on a glass substrate (first substrate) and installing an FPC or a TCP in a peripheral portion of the substrate. FIG. 7(*c*) is a cross-sectional view illustrating a step of etching back the glass substrate (first substrate) so as to produce the glass substrate into a micro glass sheet protective film. FIG. 7(*d*) is a cross-sectional view illustrating a step of installing a light source, and illustrating a finished product.

Showing the image reading apparatus in yet another embodiment of the present invention.

BEST MODE FOR CARRYING OUT THE INVENTION

The following embodiments and comparative examples provide more detailed descriptions of the present invention. It should be noted, however, that the present invention is not limited by the descriptions below.

[Embodiment 1]

One embodiment of the present invention is described below with reference to FIGS. 1 to 4.

Figure 1:
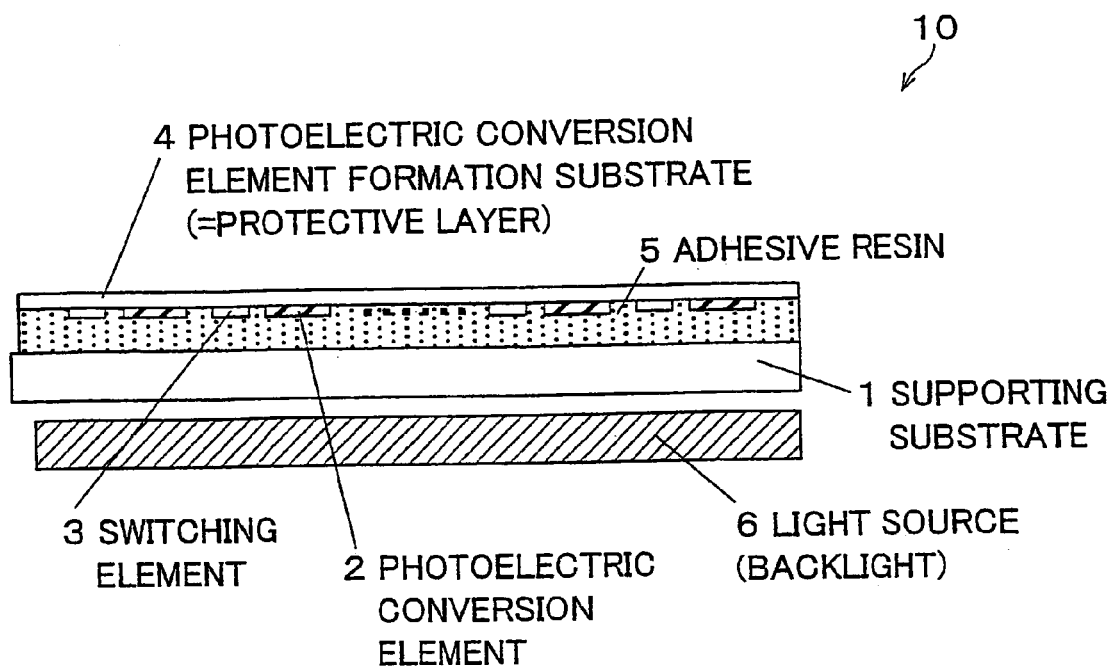
FIG. 1 is a cross-sectional view illustrating an image reading apparatus in one embodiment of the present invention.

As shown in FIG. 1, an image reading apparatus 10, which is a photoelectric conversion apparatus of the present embodiment, is so arranged that a supporting substrate 1 is bonded by an adhesive resin 5, which is an adhesive material, to a photoelectric conversion element formation substrate 4 on which photoelectric conversion elements 2 and switching elements 3 are formed. A characteristic of the image reading apparatus 10 is that the photoelectric conversion element formation substrate 4 is thinner than the supporting substrate 1.

Specifically, the photoelectric conversion element formation substrate 4 is a substrate of approximately 50 μm in thickness, while the supporting substrate 1 is a substrate of approximately 0.5 to 2 mm in thickness. This makes it possible to use the photoelectric conversion element formation substrate 4 as a protective substrate for protecting a surface that touches a document. Thus, the photoelectric conversion element formation substrate 4 is used as a protective substrate, instead of a micro glass sheet used in the conventional photoelectric conversion apparatus shown in FIG. 11. To a side associated with a light source 6, which is a backlight, provided is the supporting substrate 1 for supporting the thin photoelectric conversion element formation substrate 4. Note that pixel array may be disposed one-dimensionally or two-dimensionally.

A process of forming the image reading apparatus 10 of the above arrangement is described below with reference to FIGS. 2(a) to 2(d).

As shown in FIG. 2(a), first, as usual, the pixel array including the photoelectric conversion elements 2 are formed on a first substrate 21 that is made, for example, of a glass substrate of 0.7 mm in thickness. Each pixel includes (a) the switching element 3, such as a TFT connected to the photoelectric conversion element 2, and (b) a storage capacitor (not shown), in addition to the photoelectric conversion element 2, such as a photodiode, a phototransistor, or a photoconductor, for example. It is preferable that, in a case where visible light is to be received, an amorphous silicon film is used in the photoelectric conversion element 2 as a semiconductor film, that is, as a photoconduction film. It is also preferable that the switching elements 3 are TFTs made of amorphous silicon or polysilicon.

Figure 3:
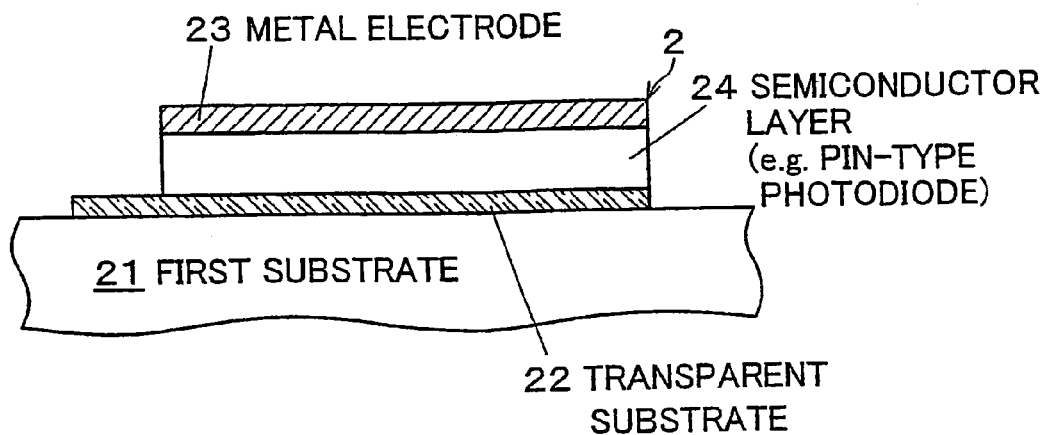
FIG. 3 is a cross-sectional view illustrating how the photoelectric conversion elements are provided to the first substrate.

Note that, in order to detect light entering from a reverse surface of the first substrate 21, that is, a reverse surface of a surface on which the photoelectric conversion elements 2 are formed, it is necessary to optimize an arrangement, that is, a direction, of the photoelectric conversion elements 2, as shown in FIG. 3. Specifically, in a case where the photoelectric conversion elements 2 are a multilayer-type diode in which a semiconductor layer 24 is sandwiched between a transparent electrode 22 and a metal electrode 23, for example, it is necessary to so design the diode that the transparent electrode 22 becomes a lower layer and the metal electrode 23 becomes an-upper layer on the first substrate 21, thereby enabling the light entering from the reverse surface of the first substrate 21 to enter into the semiconductor layer 24 via the transparent electrode 22.

Figure 4:
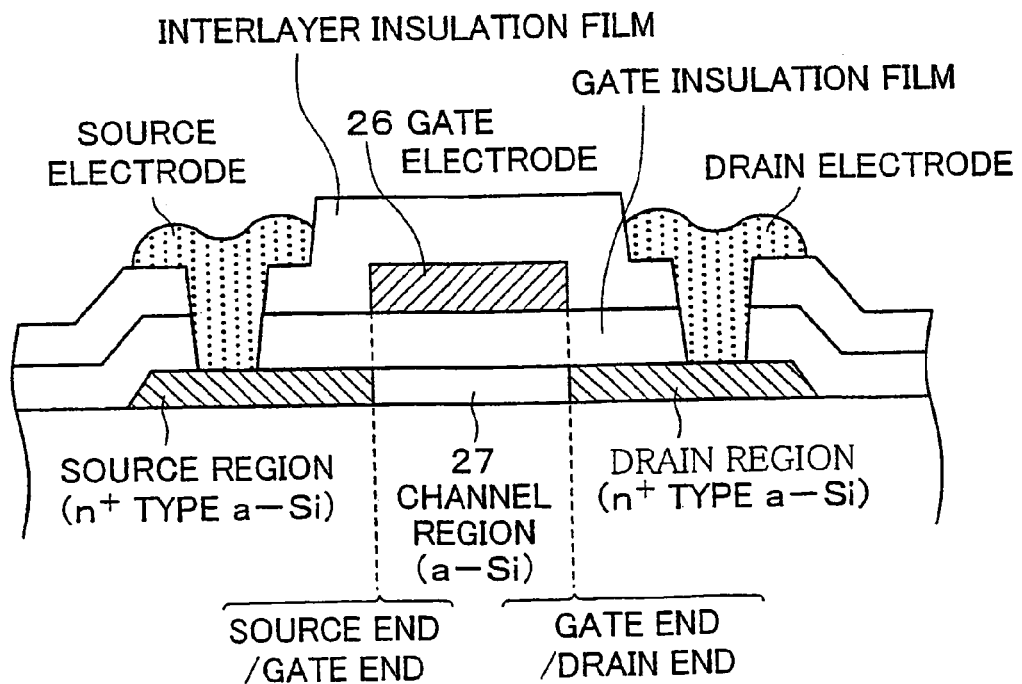
FIG. 4 is a cross-sectional view illustrating the photoelectric conversion elements including TFTs of a top gate structure.

In a case where the photoelectric conversion elements 2 are phototransistors (light-detecting TFTs), it is necessary to form top-gate-structured TFTs so that a gate electrode 26 does not hinder, from entering into the semiconductor layer 24 (channel region of the TFTs), the light entered from the reverse surface of the first substrate 21, as shown in FIG. 4. Here, the top-gate-structured TFTs are TFTs in which the gate electrode 26 is provided above a channel layer 27 (a-Si or poly-Si).

It is preferable that the photoelectric conversion elements 2 and the switching elements 3 are covered with a passivation film made of a silicon nitride film.

Next, as shown in FIG. 2(b), a second substrate 31 made of, for example, a glass substrate of 0.7 mm in thickness which functions as the supporting substrate 1 is prepared, and is bonded by using the adhesive resin 5 to a surface on which the photoelectric conversion elements 2 are provided. At this stage, the photoelectric conversion elements 2 and the switching elements 3 are completely sealed against outside air. Although various materials may be used as the adhesive resin 5, such as an epoxy resin, an acrylic resin, or a silicone resin, a transparent resin material should be used because it is necessary to allow the light from the light source 6 to efficiently pass through the adhesive resin 5.

Then, as shown in FIG. 2(c), an outer surface of the first substrate 21 is ground, by grinding or etching, to a predetermined thickness. Specifically, the first substrate 21 made of the glass substrate of 0.7 mm in thickness is ground to be 100 μm or less in thickness.

For grinding the first substrate 21, methods to be employed are mechanical grinding (physical grinding) or chemical grinding. Examples of mechanical grinding methods that may be employed here are (i) a sandblast method, in which ceramic grinding particles are sprayed, (ii) grinding by a wrapping sheet or a grinding stone, or a CMP (Chemical Mechanical Polishing) method in which abrasive particles and a chemical solvent are used in combination.

On the other hand, in a chemical grinding (sometimes called "wet etching") method that may be used here, a chemical solution is added to a tub, and heated to a predetermined temperature. Then, a glass substrate to be ground is soaked in the tub. In this method, if a hydrofluoric-acidic solution is used for processing the glass, for example, there is a possibility that an uneven pattern having a short pitch is formed on a surface of the glass, due to reactions between hydrofluoric acid and the surface of the glass. In this case, it is possible to cause the reactions to be as even as possible by adding an additive to the solvent or by controlling temperatures. By doing so, the thickness of the glass substrate can be reduced evenly.

In the present embodiment, because it is necessary to grind, easily and evenly, a glass substrate having a large area, it is preferable that the chemical grinding method employed is such that batch processing can be easily performed.

If grinding of the supporting substrate 1 is also performed in the chemical grinding, the supporting substrate 1 becomes thin, and therefore becomes unable to perform a function of the supporting substrate 1. In order to prevent this, it is preferable that a surface of the supporting substrate 1 is protected during the step of chemical grinding by, for example, a resin sheet that is resistant to a chemical grinding solution.

Alternatively, the supporting substrate 1 may be made of a plastic substrate, which is resistant to chemical grinding solvents for glass.

Besides the above-mentioned grinding methods, etching methods such as a dry etching or an RIE (Reactive Ion Etching) method may be employed so as to reduce the thickness of the glass. In the dry etching, the substrate is set in a vacuum chamber, and glass is resolved by a gas filled into the chamber. In the RIE method, a force generated by collision of ions that are accelerated by a bias is utilized in combination with the dry etching.

Figure 2:
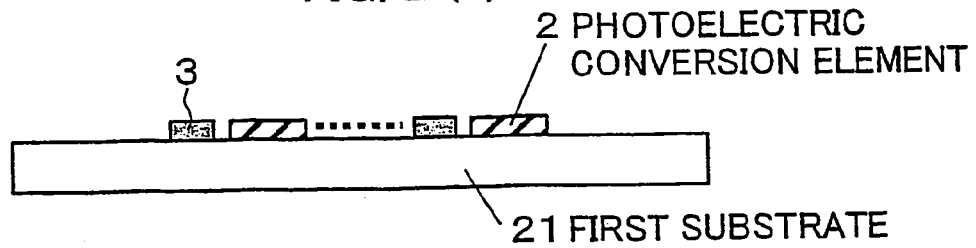
FIG. 2(*a*) is a cross-sectional view illustrating a step of forming array of switching elements and photoelectric conversion elements on a glass substrate (first substrate) in the image reading apparatus.
Figure 2:
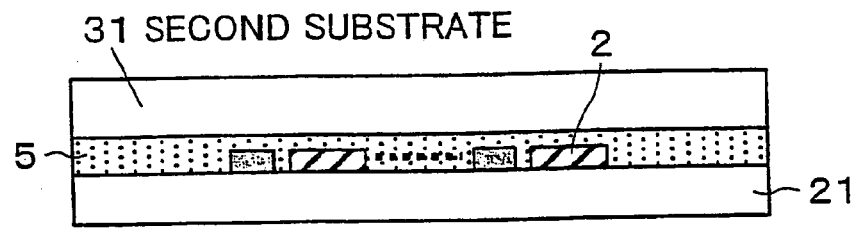
Figure 2:
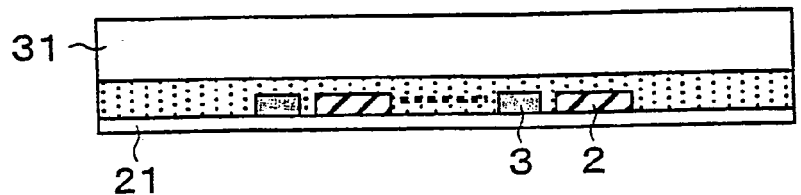
Figure 2:
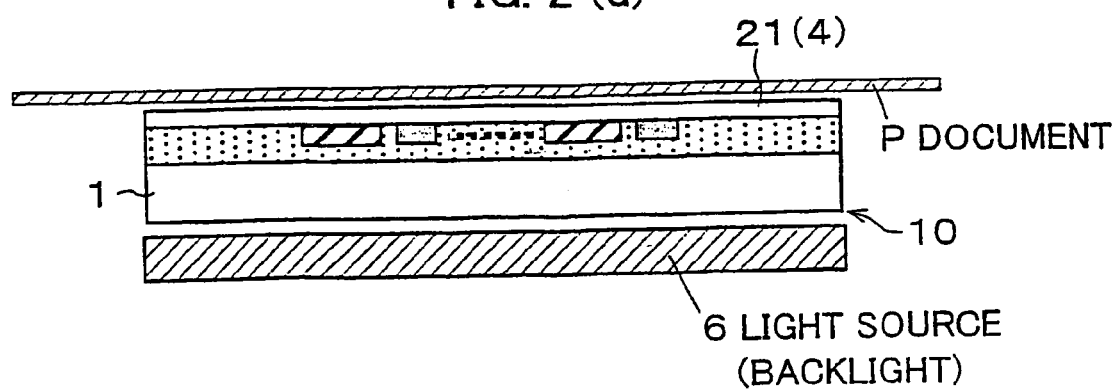

Next, as shown in FIG. 2(*d*), in a thus prepared main body of the photoelectric conversion apparatus, the light source 6 is provided under the supporting substrate 1, and a document P is placed so as to closely touch the outer surface of the first substrate 21, that is, the photoelectric conversion element formation substrate 4. In this way, it becomes possible to read a document P, as in the conventional arrangements.

With the photoelectric conversion apparatus and the manufacturing method of same, unlike in the conventional arrangements, the process of bonding the very thin micro glass sheet to the photoelectric conversion element formation substrate is not necessary.

As described above, the process of bonding the micro glass sheet is conventionally required. Here, the micro glass sheet is difficult to handle because of fragileness, and can easily be distorted. Therefore, it is difficult to evenly bond the micro glass sheet by using the adhesive resin 5 to the substrate on which the photoelectric conversion elements 2 are provided.

In contrast, because the process of bonding the micro glass sheet is not necessary in the present embodiment, it is possible to improve productivity and a rate of non-defective products.

As described above, in the image reading apparatus 10 of the present embodiment, the photoelectric conversion element formation substrate 4 has the plurality of photoelectric conversion elements formed thereon, and the supporting substrate 1 is bonded by the adhesive resin 5 to the photoelectric conversion element formation substrate 4 so that the supporting substrate 1 and the photoelectric conversion element formation substrate 4 are integrated, and so that the supporting element 1 faces the plurality of photoelectric conversion elements 2 on the photoelectric conversion element formation substrate 4.

In this arrangement, therefore, the information reading surface is the reverse surface of the photoelectric conversion element formation surface, and the photoelectric conversion element formation substrate 4 also functions as a protective substrate for protecting the photoelectric conversion elements 2 from a damage by the document P.

By adopting this arrangement, it is no longer necessary to additionally provide a micro glass sheet as a protective substrate, and to bond the micro glass sheet to the photoelectric conversion element formation substrate 4, as in the conventional arrangements.

As a result, it is possible to provide a photoelectric conversion apparatus 10 that does not require the process of bonding the micro glass sheet as a protective substrate.

Moreover, in the photoelectric conversion apparatus 10 of the present invention, the second substrate 31 is thicker than the first substrate 21. With this arrangement, it is possible to structurally reinforce the first substrate 21 by the second substrate 31, even if the first substrate 21 is thin.

Moreover, in the manufacturing method of the image reading apparatus 10 of the present embodiment, the first substrate 21 is made of glass. In the step of processing, the first substrate 21 is ground by the chemical grinding. By using a glass substrate as the first substrate 21, it is possible to employ the chemical grinding in processing the reverse surface of the first substrate 21 so as to reduce the thickness thereof. In the chemical grinding, the thickness of the glass substrate is reduced by chemical erosion caused by soaking the first substrate 21 in the solvent. This makes it possible to statically process the first substrate 21. Therefore, damages to products in a course of processing can be reduced, as compared, for example, with a case where the physical grinding is carried out.

As a result, it is possible to provide a manufacturing method of a photoelectric conversion apparatus that is capable of preventing decrease in yield of products.

Moreover, in the image reading apparatus 10 of the present invention, the plurality of photoelectric conversion elements 2 include a semiconductor layer, and there is not a metal electrode but a transparent section between the photoelectric conversion element formation substrate 4 and the semiconductor layer. As a result, reading of the document P is not hindered by the metal electrode 23 or the gate electrode 26.

[Embodiment 2]

Another embodiment of the present invention is described below with reference to FIGS. 5 and 6. Note that, for a purpose of easy explanation, members having the same functions as those of members shown in the figures in EMBODIMENT 1 are labeled with the same referential numerals, and explanations thereof are omitted.

Figure 5:
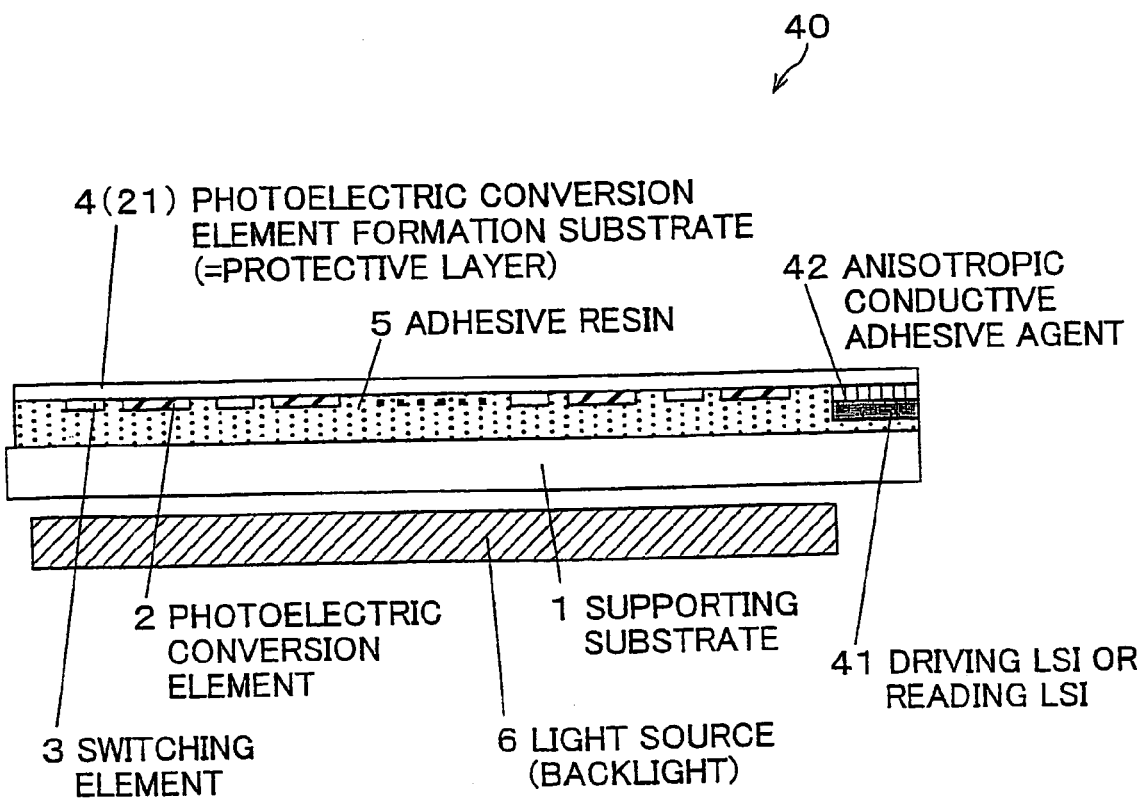
FIG. 5 is a cross-sectional view illustrating an image reading apparatus in another embodiment of the present invention.

As shown in FIG. 5, in an image reading apparatus 40, which is a photoelectric conversion apparatus of the present embodiment, pixel array including photoelectric conversion elements 2 and switching elements 3 are formed on a first substrate 21. Thereafter, an IC 41, which is a semiconductor integrated circuit such as (a) a driving IC (LSI) for driving the photoelectric conversion elements 2 and the switching elements 3, or (b) a reading IC (LSI) for reading electric signals from the photoelectric conversion elements 2, is installed in a peripheral portion of the photoelectric conversion element formation substrate 4, which is a first substrate 21.

The IC 41 may be electrically connected via an anisotropic conductive adhesive agent 42 to wiring patterns formed on the photoelectric conversion element formation substrate 4, or may be monolithically formed on the photoelectric conversion element formation substrate 4, directly.

Here, a method employed in monolithically forming the IC 41, such as the driving IC or the reading IC, is a method in which a driving circuit is integrally formed, when the switching elements 3 are formed, on the peripheral portion of the photoelectric conversion element formation substrate 4 by using TFTs that are made of poly-Si whose mobility is higher than that of a-Si. For more detail, see Shoichi MATSUMOTO ed., *The Liquid Crystal Display Technology: Active Matrix LCD*, (Sangyo Tosho Kabushiki Kaisha, 1996), particularly Chapter 3 thereof. Other arrangements are the same as those of EMBODIMENT 1.

A process of forming the image reading apparatus 40 of the above arrangement is described below, with reference to FIGS. 6(*a*) to 6(*d*). Note that, because the process of forming the image reading apparatus 40 is substantially the same as the process of forming the image reading apparatus 10 described in EMBODIMENT 1, common steps are described only in outline.

Figure 6:
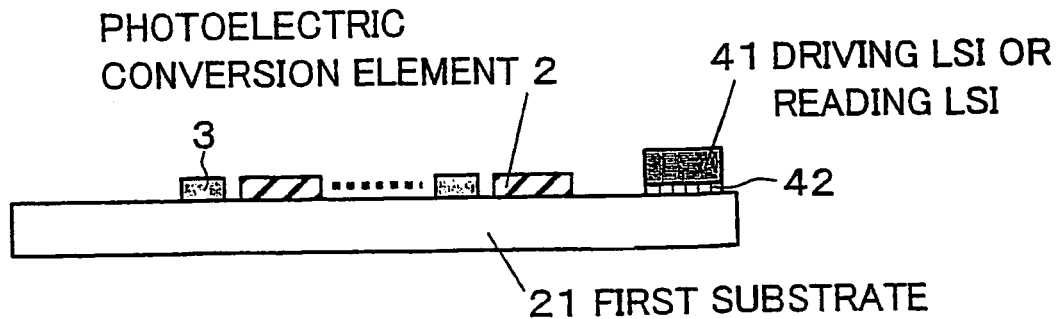
FIG. 6(*a*) is a cross-sectional view of the image reading apparatus, illustrating a step of forming array of switching elements and photoelectric conversion elements on a glass substrate (first substrate), and installing an IC in a peripheral portion of the substrate.
Figure 6:
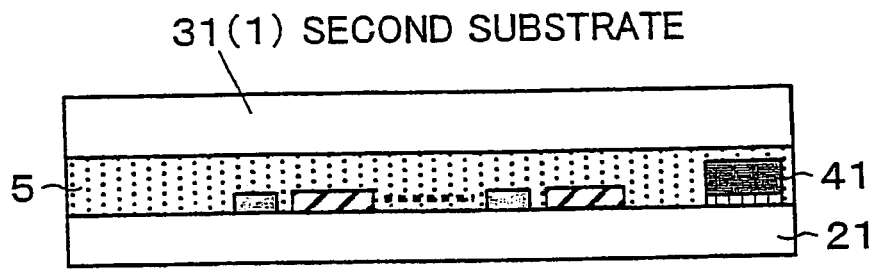
Figure 6:
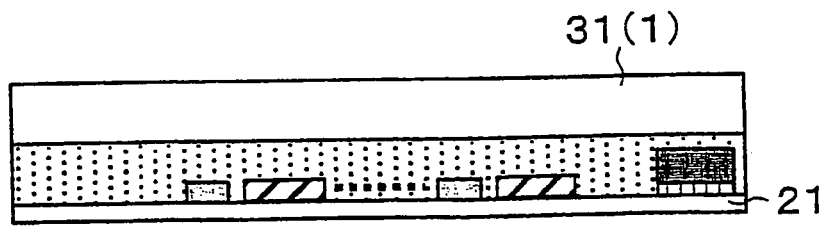
Figure 6:
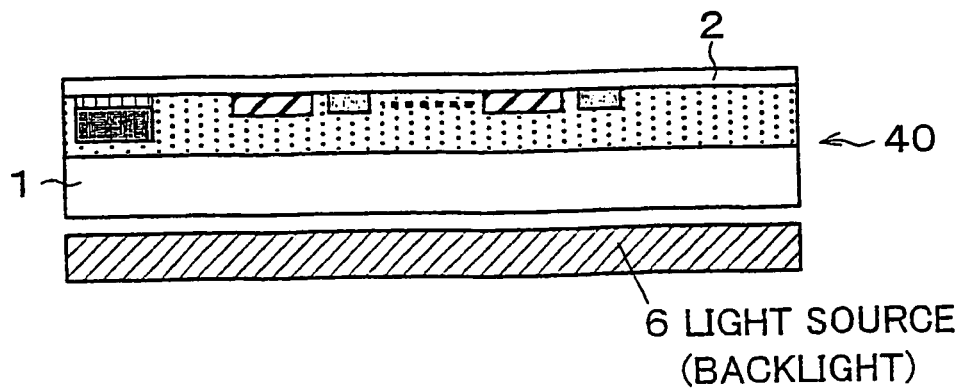

As shown in FIG. 6(*a*), first, pixel array including photoelectric conversion elements 2 are formed on the first substrate 21. Each pixel has, in addition to the photoelectric conversion element 2, for example, (a) the switching element 3, such as a TFT connected to the photoelectric conversion element 2, and (b) a storage capacitor (not shown). After that, the IC 41, such as the driving IC or the reading IC, is adhered to the peripheral portion of the first substrate 21 by using, for example, the anisotropic conductive adhesive agent 42.

Next, as shown in FIG. 6(b), a second substrate 31 for functioning as a supporting substrate 1 is bonded to the first substrate 21. An arrangement and manufacturing method of the bonded first substrate 21 and the second substrate 31 are the same as those in FIG. 2(b) of EMBODIMENT 1. However, at this time, it is preferable that an installation portion of the IC 41, such as the driving IC or the reading IC, is simultaneously sealed by using an adhesive resin 5 for connecting the first substrate 21 and the second substrate 31.

Next, as shown in FIG. 6(c), an outer surface of the first substrate 21 is ground, by etching or grinding, to a predetermined thickness. This step of grinding the first substrate 21 to a predetermined thickness by etching or grinding is the same as that of FIG. 2(c) in EMBODIMENT 1.

Then, as shown in FIG. 6(d), in a thus prepared main body of the photoelectric conversion apparatus, a light source 6 is provided under the supporting substrate 1, and a document P is caused to closely touch the outer surface of the first substrate 21, which functions as the photoelectric conversion element formation substrate 4. In this way, it becomes possible to read the document P, as in the conventional arrangements.

In addition to features of the image reading apparatus 10 described in EMBODIMENT 1, the image reading apparatus 40 and a manufacturing method of same have the following features.

Even if there is the installation portion of IC 41, such as the driving IC or the reading IC, in the peripheral portion of the image reading apparatus 40, the installation portion is completely molded. Because of this, the installation portion is not exposed to or does not protrude toward the document P. Therefore, it is unnecessary to provide, unlike the conventional arrangements, a protective cover to the installation portion. This makes it possible to attain a completely flat a surface of the image reading apparatus 40 that closely touches the document P. As a result, even if a size of the document P is larger than an image-pickup surface of the image reading apparatus 40, the document P closely contacts a document-reading surface without warping in a vicinity of the IC 41, thereby preventing a phenomenon in which an image read from the document P is blurred.

As described above, in the image reading apparatus 40 of the present embodiment, the IC 41, which is necessary for driving the plurality of photoelectric conversion elements 2, is installed on a reverse surface of an information reading surface in the peripheral portion of the photoelectric conversion element formation substrate 4.

Therefore, because the IC 41 is provided on the reverse surface of the information reading surface, the information surface is a flat and smooth surface of the photoelectric conversion element formation substrate 4. Thus, unlike in the conventional arrangements, the protrusion of the installation portion of the IC 41 or the like toward the surface of the document is eliminated.

As a result, it is possible to provide an image reading apparatus 40 that eliminates the protrusion of the installation portion toward the surface of the document.

In a manufacturing method of the image reading apparatus 40 of the present embodiment, first, in a step of installing, the plurality of photoelectric conversion elements 2 and the IC 41, which is necessary for driving the plurality of photoelectric conversion elements 2, are installed on the reverse surface of the information reading surface of the first substrate 21. Then, in a step of bonding, the second substrate 31 is bonded to the first substrate 21 by using the adhesive resin 5, so as to cover the photoelectric conversion elements 2 and the IC 41, which are installed on the reverse surface of the information reading surface of the first substrate 21. After that, in a step of processing, the information reading surface of the first substrate 21 is ground by etching or grinding, so as to reduce a thickness of the first substrate 21.

With this arrangement, the process of bonding a micro glass sheet as a protective substrate, which is conventionally carried out, is no longer necessary. As a result, it is, easy to manufacture the photoelectric conversion apparatus 40.

Conventionally, the thin micro glass sheet is bonded as a protective substrate. Therefore, one problem in handling the thin micro glass sheet is that the thin micro glass sheet is often damaged.

In contrast, in the present embodiment, the reverse surface of the photoelectric conversion element formation substrate 4 is ground after the photoelectric conversion elements 2 are formed on the photoelectric conversion element formation substrate 4, in order to eliminate the step of bonding the micro glass sheet as a protective substrate. In this way, a damage to the protective substrate is avoided. As a result, it is possible to prevent a yield of products from being lowered Therefore, it is possible to provide a manufacturing method of a photoelectric conversion apparatus 40 that does not require the process of bonding the micro glass sheet and that is capable of preventing the yield of products from being lowered.

Moreover, in the present invention, not only the plurality of photoelectric conversion elements 2, but also the IC 41, which is necessary for driving the photoelectric conversion elements 2, is installed in the step of installing. Therefore, the IC 41 is formed on the reverse surface of the information reading surface. As a result, the information reading surface is a flat and smooth surface of the photoelectric conversion element formation substrate 4, and the protrusion of the installation portion of the IC 41 or the like toward the surface of the document, which exists in the conventional arrangement, is eliminated.

As a result, it is possible to provide a manufacturing method of a photoelectric conversion apparatus 40 that eliminates the protrusion of the installation portion toward the surface of the document.

[Embodiment 3]

Yet another embodiment of the present invention is described below with reference to FIGS. 7 to 9. Note that, for a purpose of easy explanation, members having the same functions as those of members shown in the figures in EMBODIMENT 1 and EMBODIMENT 2 are labeled with the same referential numerals, and explanations thereof are omitted.

In EMBODIMENT 2, the IC 41, such as the driving IC or the reading IC, is installed in the peripheral portion of the first substrate 21. However, the present invention is not limited to this arrangement. As shown in FIG. 7(d), the IC 41 or the like may be directly installed in the peripheral portion of the first substrate 21 by using a COG method. Alternatively, an image reading apparatus 50 may be such a photoelectric conversion apparatus that adopts a method of externally providing the IC 41 or the like by using an FPC or a TCP 51. It should be noted that both the FPC and the TCP 51 may be provided. Furthermore, such a method may be employed in which the IC 41, such as the driving IC or the reading IC, is monolithically formed, and only a power source for the IC 41, such as the driving IC or the reading IC, is externally supplied by the FPC.

A process of forming the image reading apparatus 50 of the above arrangement is described below, with reference to FIGS. 7(*a*) to 7(*d*). Note that, because the process of forming the image reading apparatus 50 is substantially the same as the process of forming the image reading apparatus 10 described in EMBODIMENT 1 and the image reading apparatus 40 described in EMBODIMENT 2, common steps are described only in outline.

Figure 7:
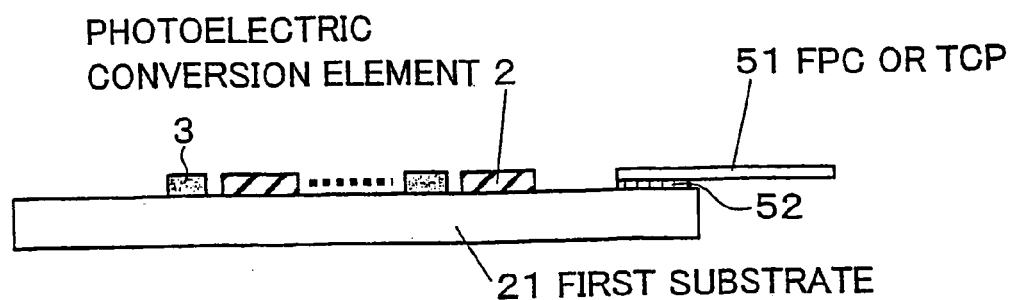
FIG. 7(*b*) is a cross-sectional view illustrating a step of bonding a facing supporting substrate (second substrate) by an adhesive agent.
Figure 7:
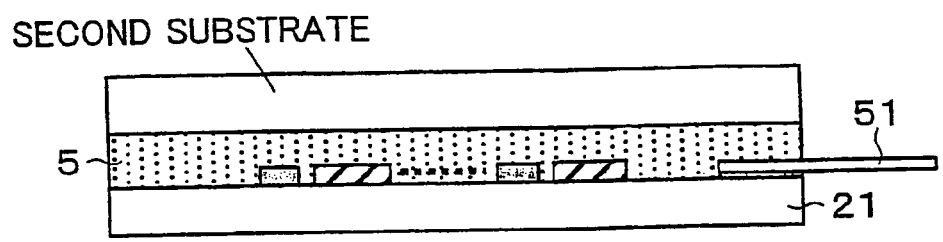
Figure 7:
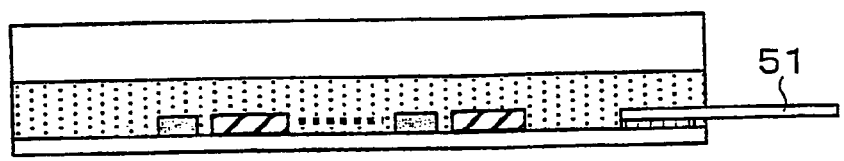
Figure 7:
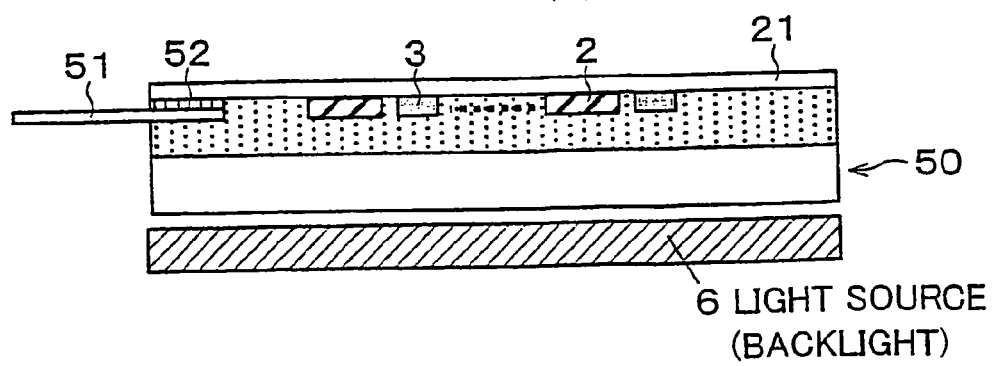
Figure 8:
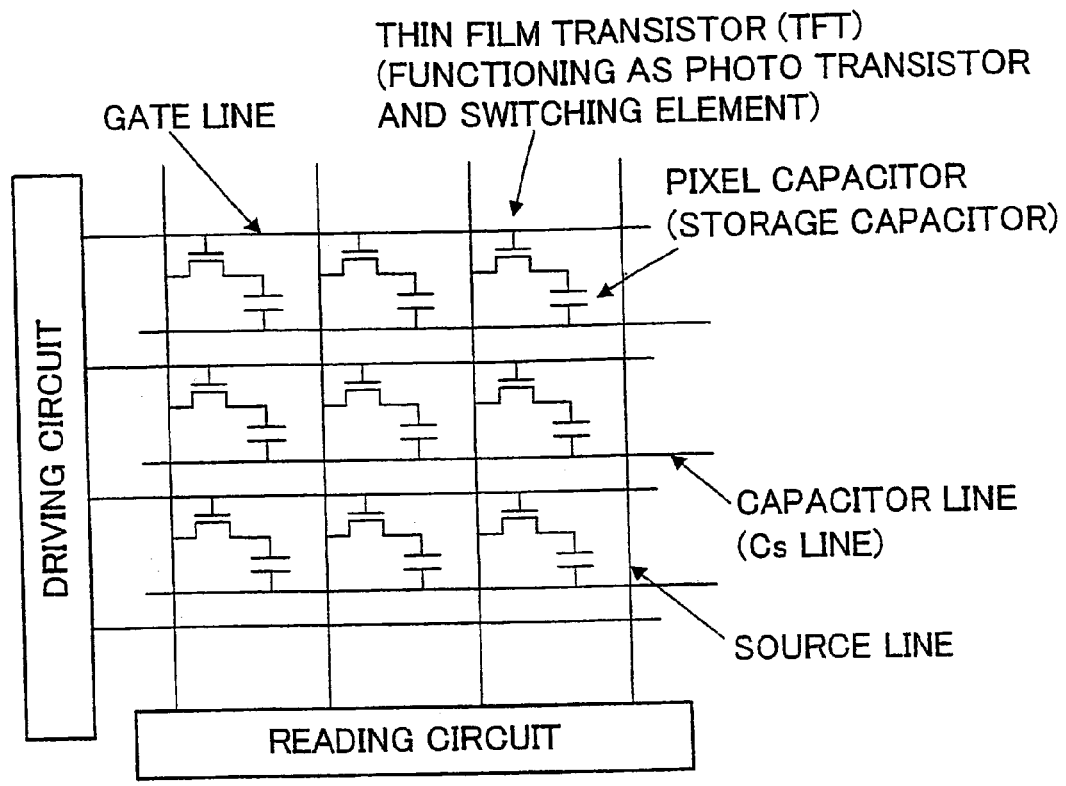
FIG. 8 is a plan view illustrating such an image reading apparatus in which a single TFT functions as (a) a phototransistor as a photoelectric conversion element and (b) a transistor as a switching element.

As shown in FIG. 7(*a*), first, pixel array including photoelectric conversion elements 2 are formed on the first substrate 21. Each pixel includes, in addition to the photoelectric conversion element 2, for example, (a) the switching element 3, such as a TFT connected to the photoelectric conversion element 2, and (b) a storage capacitor (not shown). After that, the FPC or the TCP 51 is adhered to the peripheral portion of the first substrate 21 by using, for example, an anisotropic conductive adhesive agent 52.

Next, as shown in FIG. 7(*b*), a second substrate 31 for functioning as a supporting substrate 1 is bonded to the first substrate 21. An arrangement and manufacturing method of the thus bonded first substrate 21 and the second substrate 31 are the same as those in FIG. 2(*b*) of EMBODIMENT 1 and in FIG. 6(*b*) of EMBODIMENT 2. At this time, it is preferable that sealing of an installation portion of the FPC or the TCP 51 is also carried out by using an adhesive resin 5 for connecting the first substrate 21 and the second substrate 31.

Next, as shown in FIG. 7(*c*), an outer surface of the first substrate 21 is ground, by etching or grinding, to a predetermined thickness. This step of grinding the first substrate 21 to a predetermined thickness by etching or grinding is identical to those of FIG. 2(*c*) in EMBODIMENT 1 and FIG. 6(*c*) in EMBODIMENT 2. However, at this time, it is preferable that the FPC or the TCP 51 that protrudes from an edge is molded by using a resin or the like, so that the FPC or the TCP 51 does not touch a chemical grinding solvent.

Then, as shown in FIG. 7(*d*), in a thus prepared main body of the photoelectric conversion apparatus, a light source 6 is provided under the supporting substrate 1, and a document P is caused to closely touch the outer surface of the first substrate 21, which functions as the photoelectric conversion element formation substrate 4. In this way, it becomes possible to read the document P, as in the conventional arrangements.

In addition to features of the image reading apparatus 10 described in EMBODIMENT 1 and of the image reading apparatus 40 described in EMBODIMENT 2, the image reading apparatus 50 and a manufacturing method of same have the following features.

Even if there is the installation portion of the FPC or the TCP 51 in the peripheral portion of the image reading apparatus 50, the installation portion is completely molded. Because of this, the installation portion is not exposed to or does not protrude toward the document P. Therefore, it is unnecessary to provide, unlike in the conventional arrangements, a protective cover to the installation portion. This makes it possible to attain a completely flat surface of the image reading apparatus 50 that closely touches the document P. As a result, even if a size of the document P is larger than an image-pickup surface of the image reading apparatus 50, it is possible to prevent a phenomenon in which an image read from the document P is blurred.

As described above, in the image reading apparatus 50 of the present embodiment, the FPC or the TCP 51, which is necessary for driving the plurality of photoelectric conversion elements 2, is installed in the peripheral portion of the photoelectric conversion element formation substrate 4 on a reverse surface of an information reading surface.

Therefore, because the FPC or the TCP 51 is provided on the reverse surface of the information reading surface, the information surface is a flat and smooth surface of the photoelectric conversion element formation substrate 4. Thus, the protrusion of the installation portion of the FPC or the TCP 51 toward the surface of the document, which exists in the conventional arrangement, is eliminated.

As a result, it is possible to provide an image reading apparatus 50 in which the protrusion of the installation portion toward the surface of the document is eliminated.

A manufacturing method of the image reading apparatus 50 of the present embodiment includes the steps of: installing, on a reverse surface of an information reading surface of the first substrate 21, (a) the plurality of photoelectric conversion elements 2 and (b) the FPC or the TCP 51, which is necessary for driving the plurality of photoelectric conversion elements 2; bonding the second substrate 31 by the adhesive resin 5 to the first substrate 21 so that the second substrate 31 covers the plurality of photoelectric conversion elements 2 installed on the reverse surface of the information reading surface of the first substrate 21; and processing the information reading surface of the first substrate 21 by etching or grinding so as to reduce a thickness of the first substrate 21.

Therefore, it is possible to provide a manufacturing method of the image reading apparatus 50 that does not require the process of bonding a micro glass sheet and that is capable of preventing a yield of products from being lowered.

Moreover, in the present embodiment, not only the plurality of photoelectric conversion elements 2, but also the FPC or the TCP 51, which is necessary for driving the photoelectric conversion elements 2, is installed on the reverse surface of the information reading surface in the step of installing.

Because the FPC or the TCP 51 is formed on the reverse surface of the information reading surface, the information reading surface is a flat and smooth surface of the photoelectric conversion element formation substrate 4. Thus, the protrusion of the installation portion of the FPC or the TCP 51 toward the surface of the document, which exists in the conventional arrangement, is eliminated.

As a result, it is possible to provide a manufacturing method of a photoelectric conversion apparatus 50 in which the protrusion of the installation portion toward the surface of the document is eliminated.

The invention being thus described, it will be obvious that the same way may be varied in many ways. Such variations are not to be regarded as a departure from the spirit and scope of the invention. For example, in EMBODIMENT 1 to EMBODIMENT 3, the arrangements described are such that each pixel in the photoelectric conversion apparatuses separately includes the photoelectric conversion element 2 and the switching element 3. However, the present invention is not limited to this arrangement. For example, as shown in FIG. 8, the present invention is applicable to such a photoelectric conversion apparatus in which a single TFT performs functions of a phototransistor as the photoelectric conversion element 2 and a transistor as the switching element 2.

Figure 9:
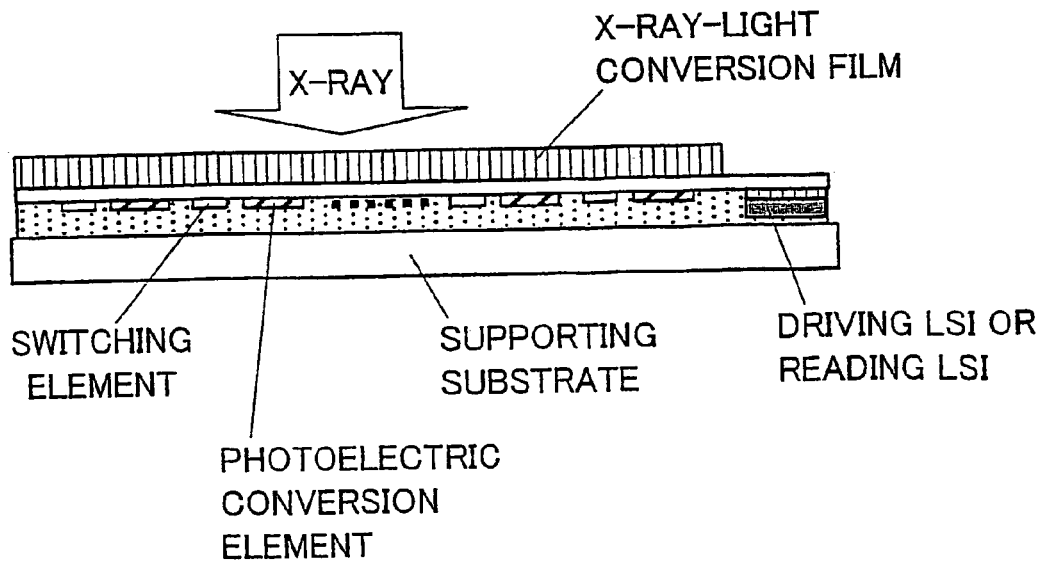
FIG. 9 shows the image reading apparatus in yet another embodiment of the present invention by a cross-sectional view illustrating an arrangement of the image reading apparatus for use as an image-pickup apparatus that deals with X-rays by an indirect conversion method.

Moreover, the photoelectric conversion apparatus of the present embodiment may be used, for example, as an image-pickup apparatus that deals with an X-ray by an indirect conversion method, by forming an X-ray-to-light conversion film (often called scintillator or intensifying screen) on the outer surface of the protective substrate, as shown in FIG. 9.

In this case, it is preferable that the X-ray-to-light conversion film is made of CsI:T1, Gd2O2S:Tb, or the like. An X-ray that passes through a human body or a test subject is converted into a visible light image by the X-ray-to-light conversion film. An image of the X-ray can be obtained by receiving the visible light image by the photoelectric conversion apparatus.

[Embodiment 4]

A further embodiment of the present invention is described below with reference to FIGS. 10 to 12. Note that, for a purpose of easy explanation, members having the same functions as those of members shown in the figures in EMBODIMENT 1 to EMBODIMENT 3 are labeled with the same referential numerals, and explanations thereof are omitted.

In EMBODIMENT 1 to EMBODIMENT 3, described are such photoelectric conversion apparatuses and manufacturing methods of the same in which (a) the process of bonding the micro glass sheet as a protective substrate is not required, and (b) the protrusion of the installation portion toward the surface of the document is eliminated. However, the arrangements of the present invention are also applicable to a photoelectric conversion apparatus having a displaying function. The following specifically describes a photoelectric conversion apparatus having a built-in displaying function.

Figure 10:
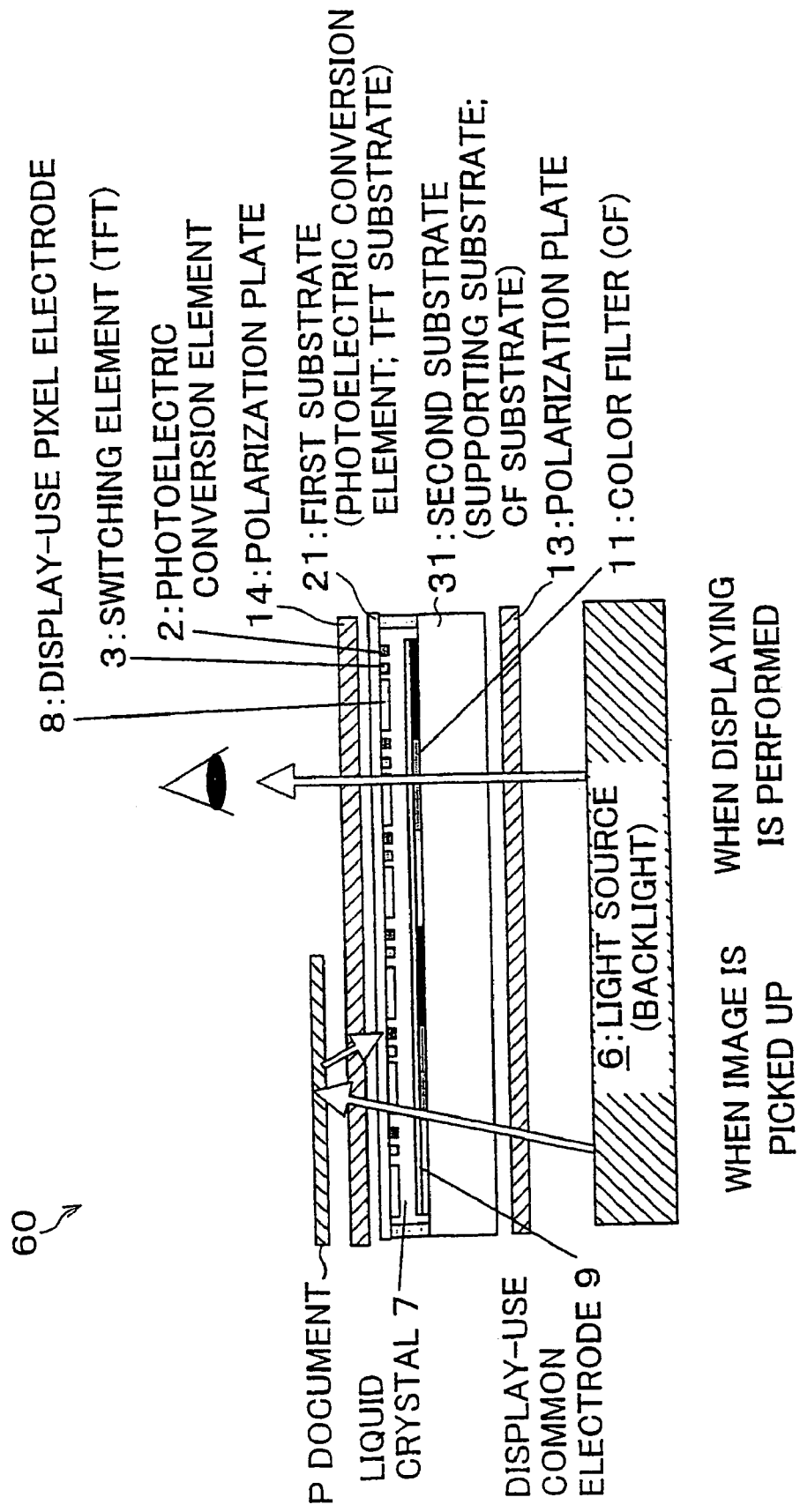
FIG. 10 shows an image reading apparatus in a further embodiment of the present invention by a cross-sectional view illustrating an arrangement of an image reading apparatus having a function of displaying by liquid crystal.

As shown in FIG. 10, an image reading apparatus 60 of the present embodiment is a photoelectric conversion apparatus having a built-in displaying function that uses liquid crystal as a displaying medium.

In the image reading apparatus 60, photoelectric conversion elements 2 are formed for respective pixels on a first substrate 21, as in EMBODIMENT 1. On a surface on which the photoelectric conversion elements 2 are formed, display-use pixel electrodes 8 for driving a display medium (liquid crystal 7, described later) are formed for the respective pixels. Also provided is a switching element 3 as an active element for controlling transfer of signal to the photoelectric conversion element 2 and to the display-use pixel electrodes 8. As the switching element 3, a TFT is suitably used. The TFTs may be provided for the photoelectric conversion element 2 and for the switching element 3 separately, that is, a plurality of TFTs may be provided to each pixel. Alternatively, a single TFT may be used for driving the photoelectric conversion element 2 and the switching element 3 per pixel.

On the other hand, on a second substrate 31 as a supporting substrate and as a CF (color filter) substrate, a color filter (CF) 11 and a display-use common electrode (such as an ITO) 9 are formed. The first substrate 21 and the second substrate 31 are fixed by adhesion by using a sealing material, and the liquid crystal 7 is sealed between the first substrate 21 and the second substrate 31.

A backlight, which is a light source 6, functions as a light source for illuminating a photographic object while an image is read, and as a backlight for the liquid crystal display while the image is displayed.

Here, as described in EMBODIMENT 1, it is necessary to reduce the thickness of the first substrate 21 as much as possible, so as to prevent blurring in the image of the photographic object that has been read. On the other hand, the second substrate 31, which faces the first substrate 21 via a liquid crystal layer, is so designed as to be thicker than the first substrate, so as to improve mechanical strength of a main panel.

As a result, it is possible to enhance the mechanical strength of the main panel, while keeping blurring in the image at minimum. It is of course possible, as in EMBODIMENT 1, to ensure that the photographic object and an information reading surface are in close contact with each other, because a portion where electric members (such as an IC, a TCP, and an FPC), which are necessary for driving the photoelectric elements 2, are installed does not protrude toward the photographic object.

As in an image reading apparatus 61 shown in FIG. 11, it may be so arranged that (a) a thickness of the first substrate 21 and a thickness of a color filter (CF) substrate 12 including a color filter (CF) 11 that faces the first substrate 21 are simultaneously reduced in the process of reducing the thickness of the first substrate 21, (b) the second substrate 31 is separately prepared as a supporting substrate, and (c) the second substrate 31 is provided below the color filter (CF) substrate 12.

In this case, a polarization plate 13 may be located between the color filter (CF) substrate 12 and the second substrate 31, or may be located below the second substrate 31, that is, on a side associated with the light source 6, as shown in FIG. 10.

Usually, if the first substrate 21 and the color filter (CF) substrate 12 that are made of the same material (e.g. glass) are bonded together and are soaked in a chemical etching solution, not only the first substrate 21, but also the color filter (CF) substrate 12 are usually etched to a similar extent, and are simultaneously reduced in thickness. Because of this, it is often difficult to use the color filter (CF) substrate 12 as a supporting substrate. It is therefore preferable that the second substrate 31 is additionally prepared so as to have the arrangement of the image reading apparatus 61 shown in FIG. 11.

It may, also be so arranged that a single member functions as the light source 6, and the second substrate 31 that plays a role of a supporting substrate. In this case, a light guide plate included in the light source 6 functions as the supporting substrate.

In a case where a display mode of the liquid crystal 7 requires a polarizer, as in a case of a TN (Twisted Nematic) mode, it is necessary to insert a polarization plate 14 as a polarizer between the surface on which the photoelectric conversion elements 2 are provided and an object of reading (such as a document P), as shown in FIG. 10. Because a thick polarization plate 14 aggravates the blurring of the image, it is necessary that a thickness of the polarization plate 14 be designed as thin as possible.

Figure 12:
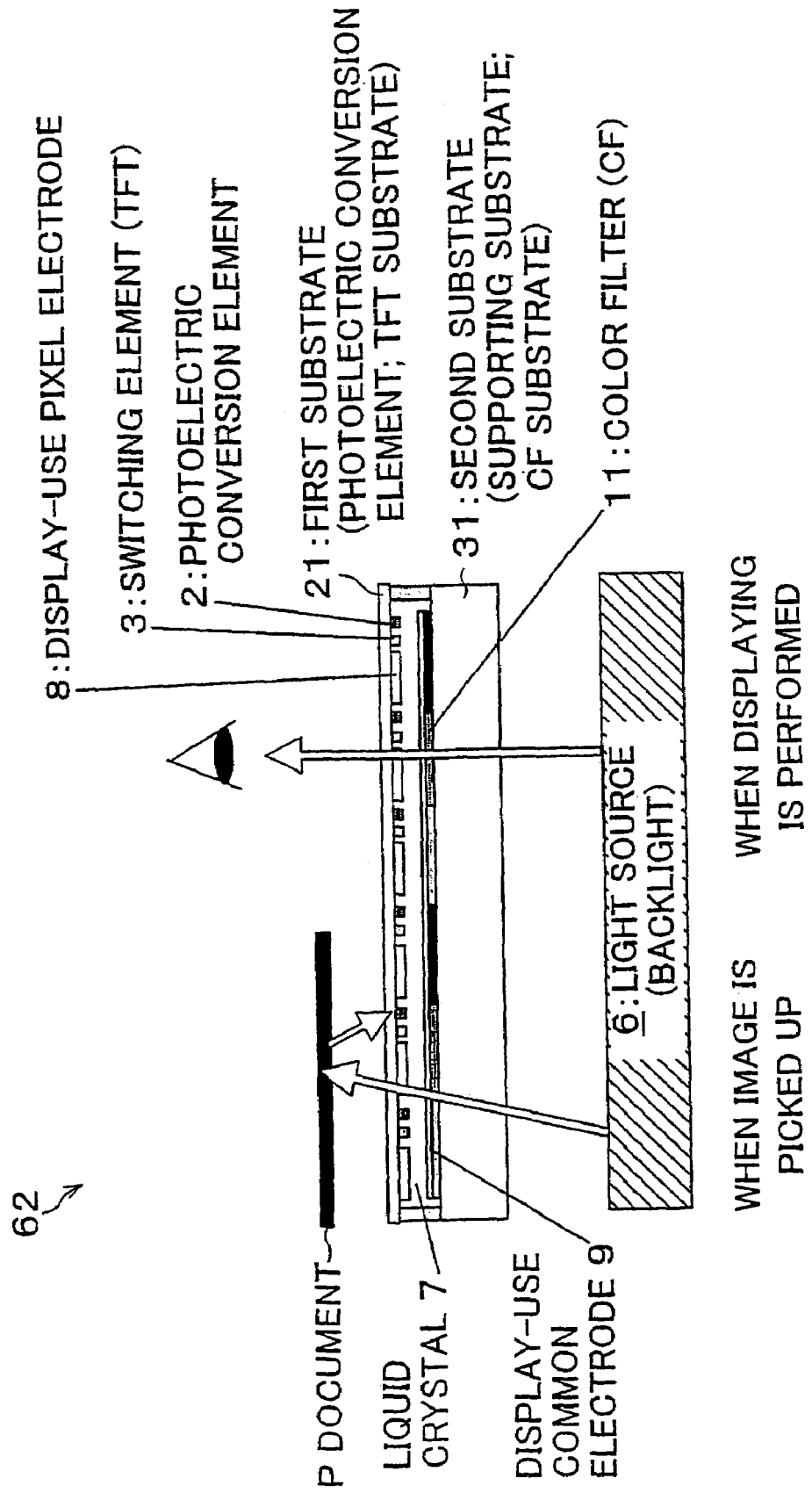
FIG. 12 shows an arrangement of another modification example of the image reading apparatus by a cross-sectional view illustrating an arrangement of an image reading apparatus employing a display mode that does not require a polarizer.

On the other hand, in a case where a display mode of the liquid crystal 7 does not require the polarization plate 14, as in a case of a guest host mode, it is not necessary to provide the polarization plate 14 between the surface on which the photoelectric conversion elements 2 are provided and the object of reading (such as the document P), as in an image reading apparatus 62 shown in FIG. 12. This is advantageous in that the blurring of the image is minimized, because a distance between the surface on which the photoelectric conversion elements 2 are provided and the object of reading (such as the document P) is minimized. Examples of liquid crystal display modes that do not require a polarizer include, in addition to the guest host (GH) mode, a dynamic scattering (DS) mode, a phase changing (PC) mode, and a polymer dispersed liquid crystal (PDLC) mode.

As described above, the image reading apparatuses 60, 61, and 62 of the present embodiment include the liquid crystal 7 between the first substrate 21 and the second substrate 31, and drive the liquid crystal 7 using the switching element 3. As a result, each of the image reading apparatuses 60, 61, and 62 is capable of reading (inputting) and displaying (outputting) the image by a single screen.

Moreover, in the image reading apparatuses 60, 61, and 62, the liquid crystal 7 can be sealed between the first substrate 21 and the second substrate 31, and the second substrate 31 can be effectively used as a counter substrate that includes the display-use common electrode 9 for driving the liquid crystal 7.

Moreover, in the image reading apparatus 62 of the present embodiment, the display mode of the liquid crystal 7 does not require a polarizer. Therefore, it is not necessary to provide the polarization plate 14 between the first substrate 21 and the document P. As a result, with the image reading apparatus 62, the blurring of the image is minimized, because the distance between the photoelectric conversion elements 2 and the document P is minimized.

Moreover, in the image reading apparatuses 60, 61, and 62, only one light source 6 is required, by using the light source 6 as a light source for illuminating the photographic object while information is read and as a display-use light source while the information is displayed. As a result, it is possible to reduce costs for members.

[Embodiment 5]

Another further embodiment of the present invention is described below with reference to FIG. 13. Note that, for a purpose of easy explanation, members having the same functions as those of members shown in the figures in EMBODIMENT 1 to EMBODIMENT 4 are labeled with the same referential numerals, and explanations thereof are omitted.

In EMBODIMENT 4, the photoelectric conversion apparatus including the liquid crystal 7 as a display medium is described. However, EL (Electro Luminescence) elements may be used instead of the liquid crystal 7. The following specifically describes a photoelectric conversion apparatus having a function of EL displaying.

Figure 13:
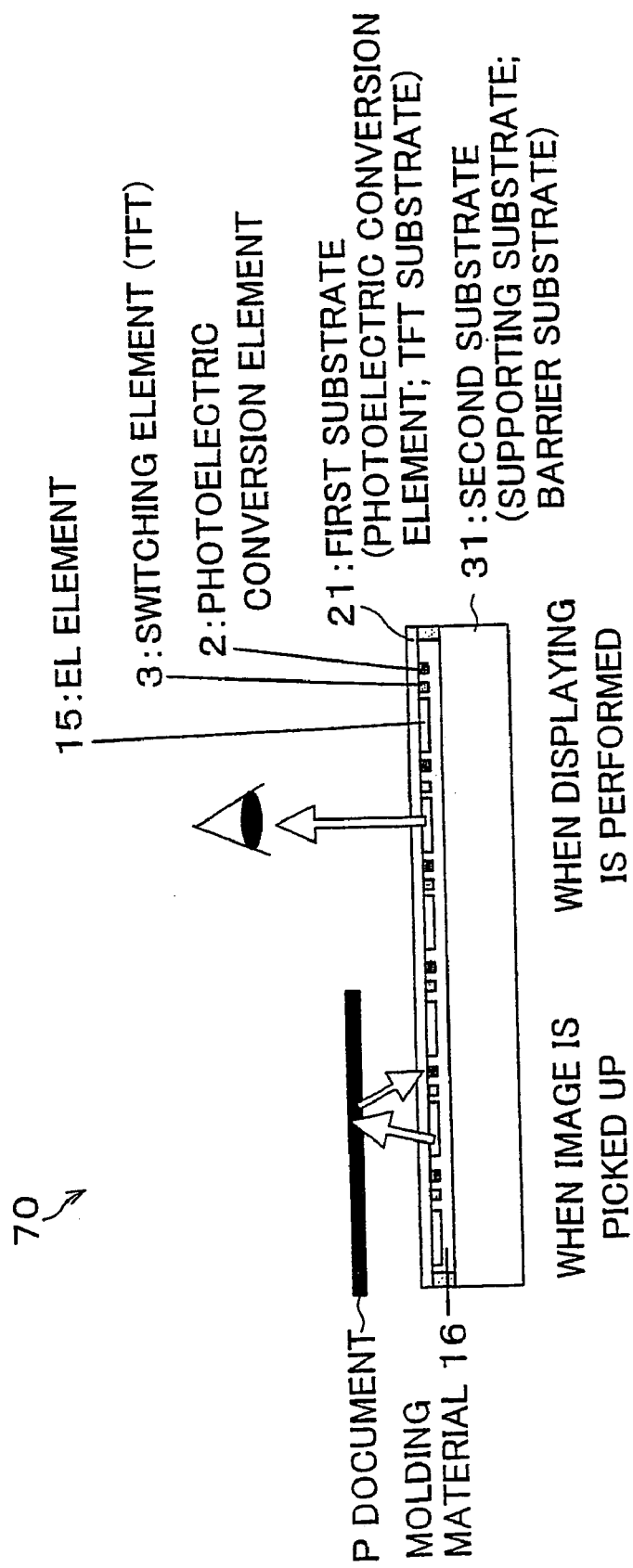
FIG. 13 shows an image reading apparatus in another further embodiment of the present invention by a cross-sectional view illustrating an arrangement of an image reading apparatus having a displaying function by using an EL element.
Figure 14:
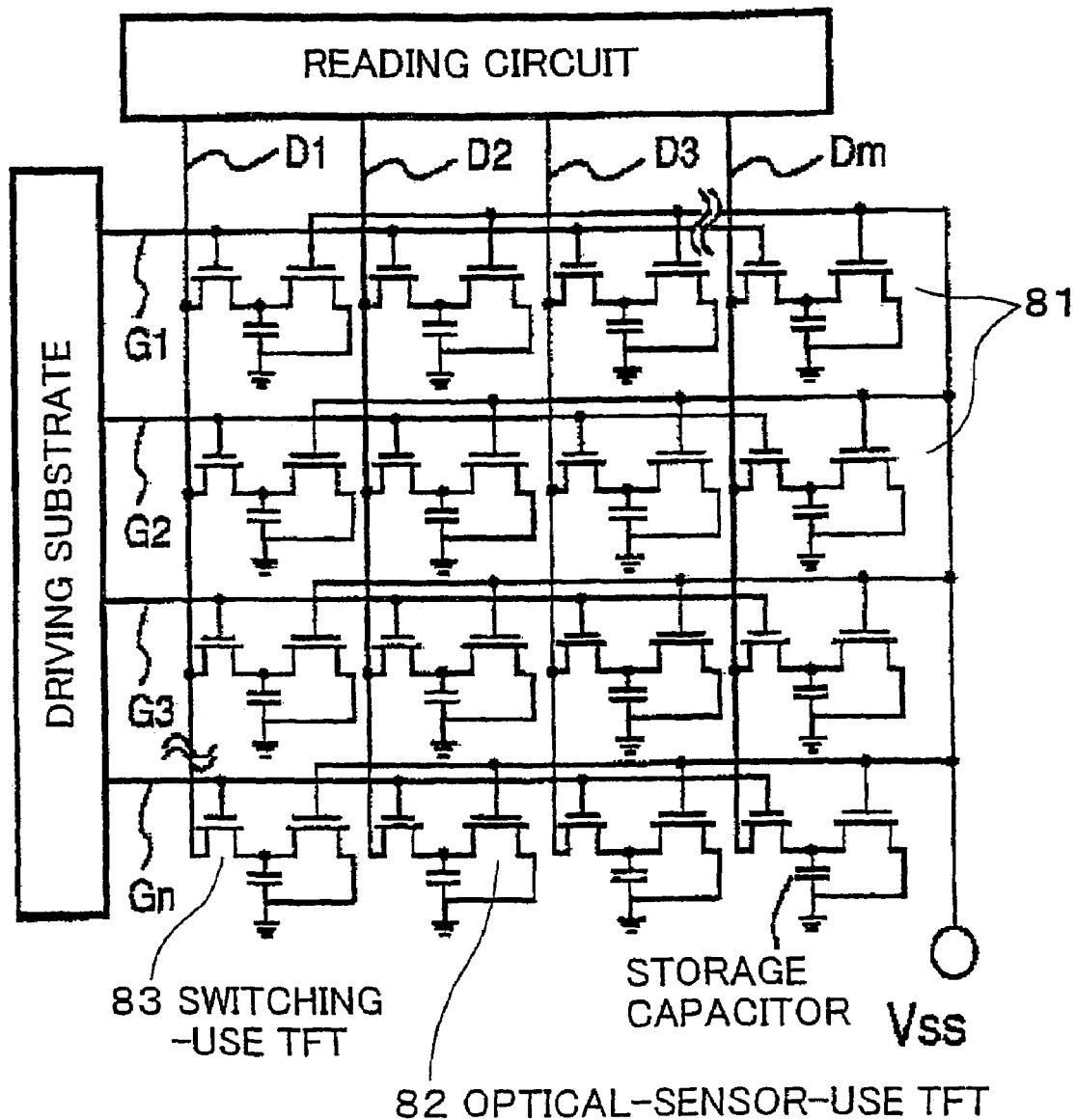
FIG. 14 is a plan view illustrating an arrangement of a conventional image reading apparatus.
Figure 15:
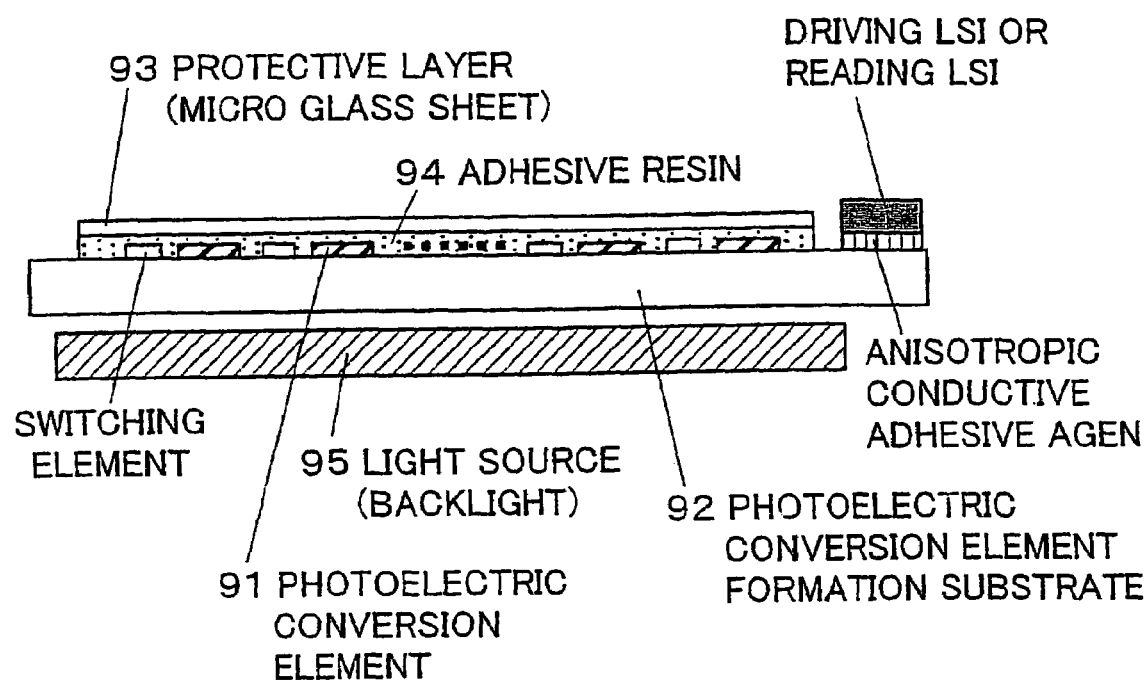
FIG. 15 is a cross-sectional view illustrating, the arrangement of the conventional image reading apparatus.

As shown in FIG. 13, a photoelectric conversion apparatus 70 of the present embodiment is a photoelectric conversion apparatus having a built-in display function by using an organic EL as a display medium.

As in EMBODIMENT 1 In the photoelectric conversion apparatus 70, a photoelectric conversion element 2 is formed per pixel on a first substrate 21, which is a photoelectric conversion element formation substrate. On a surface on which the photoelectric conversion element 2 is formed, an EL element 15 is formed per pixel. Also provided is a switching element 3 as an active element for controlling transfer of signal to the photoelectric conversion element 2 and to the EL element 15. As the switching element 3, a TFT is suitably used. The TFTs may be provided to the photoelectric conversion element 2 and to the EL element 15 separately, that is, a plurality of TFTs may be provided to each pixel. Alternatively, a single TFT may be used for driving the photoelectric conversion element 2 and the EL element 15.

On the other hand, a second substrate 31, which is a supporting substrate, may be used not only to mechanically reinforce the first substrate 21, but also as a layer (film) for shutting off outside air and moisture, which could adversely affect reliability of a barrier film of an EL layer, that is, the EL element 15. The first substrate 21 and the second substrate 31 are fixed by adhesion by a molding material 16, which is a sealing material.

Here, as described in EMBODIMENT 1, it is necessary to reduce the thickness of the first substrate 21 as much as possible, so as to prevent blurring in the image of the photographic object that has been read. On the other hand, the second substrate 31, which is a supporting substrate and a barrier substrate that faces the first substrate 31 via a layer of the EL element 15, is so designed as to be thicker than the first substrate, so as to improve mechanical strength of a main panel.

As a result, it is possible to enhance the mechanical strength of the main panel, while keeping the blurring in the image at minimum. It is of course possible, as in EMBODIMENT 1, to ensure that the photographic object and an information reading surface are in close contact with each other, because an installation portion of electric members (such as an IC, a TCP, and an FPC), which are necessary for driving the photoelectric elements 2, does not protrude toward the photographic object.

Figure 11:
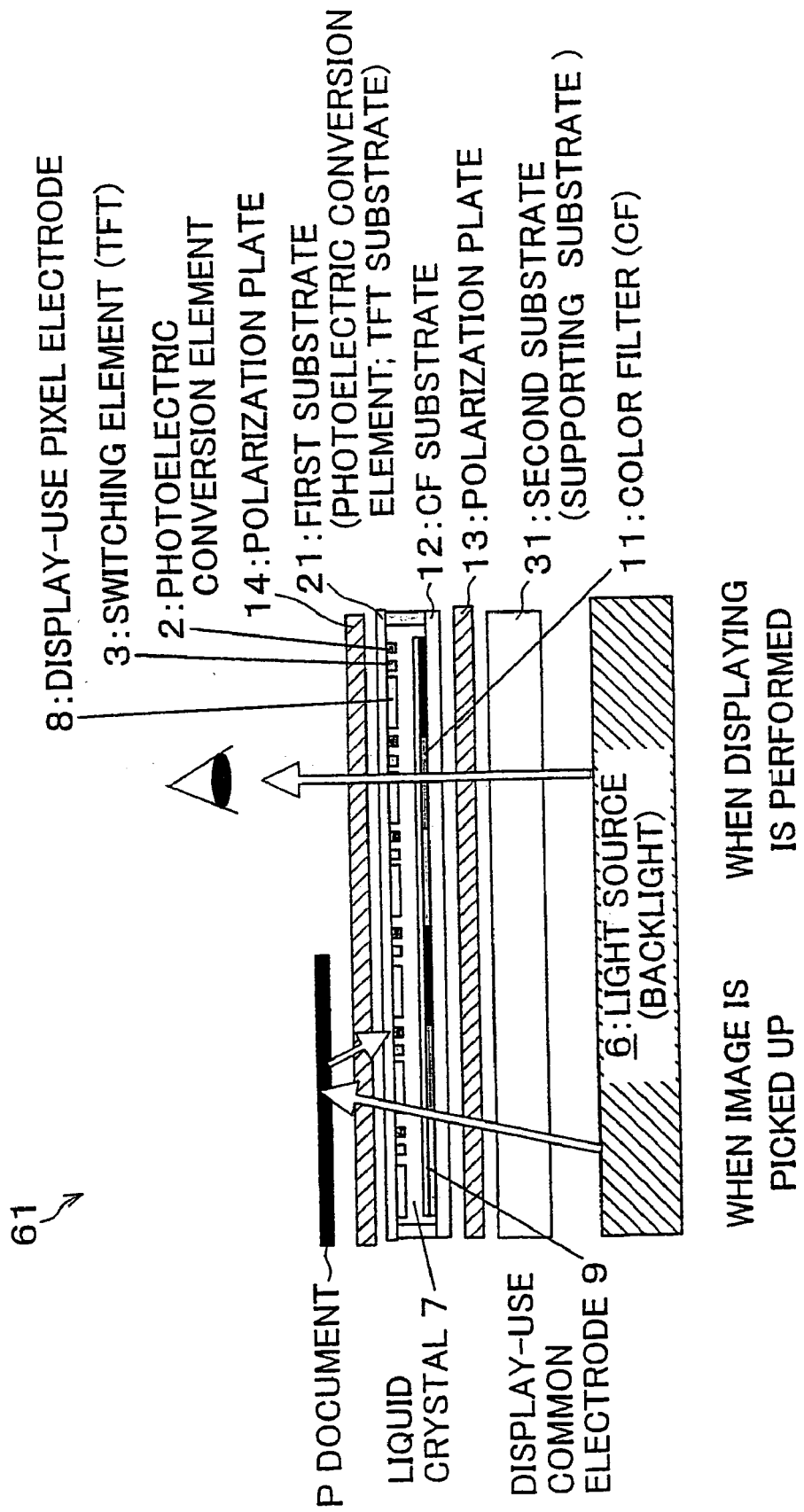
FIG. 11 shows an arrangement of a modification example of the image reading apparatus by a cross-sectional view illustrating an arrangement of an image reading apparatus in which a color filter (CF) substrate is provided in addition to a second substrate.

As in the image reading apparatus 61 of EMBODIMENT 4 shown in FIG. 11, it may be so arranged that (a) both the first substrate 21 and the barrier substrate that faces the first substrate 21 are reduced in thickness in the process of reducing a thickness of the first substrate 21, (b) the second substrate 31 is separately prepared as a supporting substrate, and (c) the second substrate 31 is provided outside of the barrier substrate.

As described above, the image reading apparatus 70 of the present embodiment uses the EL element 15 as a display medium. Therefore, it is possible to perform displaying (outputting) by using the EL element 15. Moreover, because the EL element 15 is sealed between the first substrate 21 and the second substrate 31, it is possible to effectively use the second substrate 31 as a barrier layer for the EL element 15.

Moreover, in the image reading apparatus 70, the EL element 15 is used as a light source for illuminating the photographic object while information is read, and as a light emitting element while the information is read. As a result, it is possible to reduce costs for members.

It should be noted that the present invention is not limited to the embodiments described above, and may be varied in many ways within the scope of the claims. For example, an embodiment obtained by suitably combining technical features of one embodiment with those of another embodiment should also be regarded as technical features of the present invention.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

As described, to attain the object above, a display apparatus of the present invention includes: a photoelectric conversion element formation substrate having, on a photoelectric conversion element formation surface thereof, a plurality of photoelectric conversion elements, the photoelectric conversion element formation surface being a reverse surface of an information reading surface; and a supporting substrate bonded by an adhesive material to the photoelectric conversion element formation substrate so that the supporting substrate is integrated with the photoelectric conversion element formation substrate and faces the plurality of photoelectric conversion elements on the photoelectric conversion element formation substrate.

In this invention, the photoelectric conversion element formation substrate has, on the photoelectric conversion element formation surface thereof, the plurality of photoelectric conversion elements, the photoelectric conversion element formation surface being the reverse surface of the information reading surface, and the supporting substrate is bonded by the adhesive material to the photoelectric conversion element formation substrate so that the supporting substrate is integrated With the photoelectric conversion element formation substrate and faces the plurality of photoelectric conversion elements on the photoelectric conversion element formation substrate.

With this arrangement, therefore, the information reading surface is the reverse surface of the photoelectric conversion element formation surface, and the photoelectric conversion element formation substrate also functions as a protective substrate for protecting the photoelectric conversion elements from touching the document.

Therefore, it is no longer necessary to additionally provide a micro glass sheet, which has a protective effect, and bond the micro glass sheet to the photoelectric conversion element formation substrate, unlike the conventional arrangements.

As a result, it is possible to provide a photoelectric conversion apparatus that does not require the process of bonding the micro glass sheet, which is a protective substrate.

Moreover, in the photoelectric conversion apparatus of the present invention, the supporting substrate is thicker than the photoelectric conversion element formation substrate.

With this invention, it is possible to structurally reinforce the photoelectric conversion element formation substrate by the supporting substrate, even if the photoelectric conversion element formation substrate is thin.

Moreover, in the photoelectric conversion apparatus of the present invention, a semiconductor integrated circuit. (IC), which is necessary for driving the plurality of photoelectric conversion elements, is in a peripheral portion (edge portion) of the photoelectric conversion element formation substrate on the photoelectric conversion element formation surface.

Moreover, in the photoelectric conversion apparatus of the present invention, a TCP (Tape Carrier Package) and/or an FPC (flexible printed circuit), which is necessary for driving the plurality of photoelectric conversion elements, is in a peripheral portion of the photoelectric conversion element formation substrate on the photoelectric conversion element formation surface.

In this invention, the semiconductor integrated circuit (IC), the TCP and/or the FPC is in the peripheral portion of the photoelectric conversion element formation substrate on the photoelectric conversion element formation surface. Therefore, the information reading surface is a flat and smooth surface of the photoelectric conversion element formation substrate, and the protrusion of the installation portion of the semiconductor integrated circuit (IC), the TCP, and/or the FPC, for example, which has conventionally existed, is eliminated.

As a result, it is possible to provide a photoelectric conversion apparatus in which the protrusion of the installation portion toward the surface of the document is eliminated.

Moreover, the photoelectric conversion apparatus of the present invention is a photoelectric conversion apparatus, wherein the plurality of photoelectric conversion elements include a semiconductor layer, the photoelectric conversion apparatus further including a transparent section between the photoelectric conversion element formation substrate and the semiconductor layer.

In this invention, the plurality of photoelectric conversion elements include the semiconductor layer, and the photoelectric conversion apparatus further includes the transparent section between the photoelectric conversion element formation substrate and the semiconductor layer. As a result, reading of the document is not hindered by a metal electrode.

Moreover, the photoelectric conversion apparatus of the present invention further includes an X-ray-to-light conversion film, on the information reading surface of the photoelectric conversion element formation substrate, for converting an X-ray into light.

In this invention, the photoelectric conversion apparatus further includes the X-ray-to-light conversion film on the information reading surface of the photoelectric conversion element formation substrate, for converting an X-ray into light. Therefore, the photoelectric conversion apparatus can be used as an image-pickup apparatus that deals with X-rays by an indirect conversion method.

Moreover, the photoelectric conversion apparatus of the present invention further includes: a display medium provided between the photoelectric conversion element formation substrate and the supporting substrate; and an active element on the photoelectric conversion element formation surface, for driving the display medium.

In this invention, the display medium is provided between the photoelectric conversion element formation substrate and the supporting substrate, and the display medium is driven by the active element. As a result, it is possible to realize a photoelectric conversion apparatus capable of reading (inputting) and displaying (outputting) an image by using a single screen.

Moreover, in the photoelectric conversion apparatus of the present invention, the display medium is liquid crystal.

In this invention, it is possible to seal the liquid crystal between the photoelectric conversion element formation substrate and the supporting substrate, and to effectively use the supporting substrate as a counter substrate that includes a common electrode for driving the liquid crystal.

Moreover, in the photoelectric conversion apparatus of the present invention, a display mode of the liquid crystal, which is the display medium, does not require a polarizer. Examples of liquid crystal display modes that do not require a polarizer include, in addition to the guest host (GH) mode, a dynamic scattering (DS) mode, a phase changing (PC) mode, and a polymer dispersed liquid crystal (PDLC) mode, and the like.

In this invention, it is not necessary to install a polarizer between the surface on which the photoelectric conversion elements are provided and an object of reading (such as the document P). As a result, it is possible to provide a photoelectric conversion apparatus in which the blurring of the image is minimized, because the distance between the photoelectric conversion elements and the object of reading is minimized.

Moreover, the photoelectric conversion apparatus of the present invention further includes a light source provided to one side with respect to the supporting substrate, while the photoelectric conversion element formation substrate is provided on the other side (in other words, light source provided in such a manner that the light source and the photoelectric conversion element formation substrate sandwich the supporting substrate), the light source being used as a light source for illuminating a photographic object while information is read, and as a light source for a liquid crystal display while the information is displayed.

With this invention, only one light source is required, by providing such a light source that is used as a light source for illuminating the photographic object while information is read and as a light source for a liquid crystal display while the information is displayed. As a result, it is possible to reduce costs for members.

Moreover, in the photoelectric conversion apparatus of the present invention, the display medium is an EL (Electro Luminescence) element.

With this invention, it is possible to perform displaying (outputting) by using the EL element. Moreover, because the EL element is sealed between the photoelectric conversion element formation substrate and the supporting substrate, it is possible to effectively use the supporting substrate as a layer (film) for shutting off outside air and moisture, which could adversely affect reliability of a barrier film of the EL element, that is, the EL element.

Moreover, in the photoelectric conversion apparatus of the present invention, the EL element is used as a light source for illuminating a photographic object while information is read, and as a light emitting element while the information is displayed.

In this invention, the EL element is used as a light source for illuminating the photographic object while information is read, and as a light emitting element while the information is displayed. Therefore, it is not necessary to provide another light source. As a result, it is possible to reduce costs for members.

To solve the problems above, the present invention provides a manufacturing method of a photoelectric conversion apparatus for reading information includes the steps of: installing, on a reverse surface of an information reading surface of a first substrate, (a) a plurality of photoelectric conversion elements and (b) a semiconductor integrated circuit (IC), which is necessary for driving the plurality of photoelectric conversion elements; bonding a second substrate by an adhesive material to the first substrate so that the second substrate covers the plurality of photoelectric conversion elements on the reverse surface of the information reading surface; and processing the information reading surface of the first substrate by etching or grinding so as to reduce a thickness of the first substrate.

In this invention, first, in the step of installing, installed on the reverse surface of the information reading surface of the first substrate are (a) the plurality of photoelectric conversion elements and (b) the semiconductor integrated circuit (IC), which is necessary for driving the plurality of photoelectric conversion elements. Next, in the steps of bonding, the second substrate is bonded by the adhesive material to the first substrate so that the second substrate covers the plurality of photoelectric conversion elements on the reverse surface of the information reading surface of the first substrate. Thereafter, in the step of processing, the information reading surface of the first substrate is processed by etching or grinding so as to reduce the thickness of the first substrate.

With this invention, the step, which is conventionally carried out, of bonding a micro glass sheet as a protective substrate is no longer necessary. As a result, it is easy to manufacture the photoelectric conversion apparatus.

Conventionally, a thin micro glass sheet is bonded as a protective substrate. Therefore, one problem in handling the thin micro glass sheet is that the thin micro glass sheet is often damaged.

In contrast, in the present invention, the reverse surface of the photoelectric conversion element formation substrate is ground after the photoelectric conversion elements are formed, in order to eliminate the step of bonding the micro glass sheet as a protective substrate. In this way, a problem of damage to the protective substrate is avoided. Therefore, it is possible to prevent a yield of products from being lowered.

Therefore, it is possible to provide a manufacturing method of a photoelectric conversion apparatus that does not require the process of bonding the micro glass sheet and that is capable of preventing the yield of products from being lowered.

Moreover, in the present invention, not only the plurality of photoelectric conversion elements, but also the semiconductor integrated circuit (IC), which is necessary for driving the photoelectric conversion elements, is installed in the step of installing. Therefore, the semiconductor integrated circuit (IC) is formed on the reverse surface of the information reading surface. As a result, the information reading surface is a flat and smooth surface of the photoelectric conversion element formation substrate, and the protrusion of the installation portion of the semiconductor integrated circuit (IC), the TCP, and/or the FPC, for example, which has conventionally existed, is eliminated.

As a result, it is possible to provide a manufacturing method of a photoelectric conversion apparatus in which the protrusion of the installation portion toward the surface of the document is eliminated.

To solve the problems above, the present invention provides a manufacturing method of a photoelectric conversion apparatus for reading information, including the steps of: installing, on a reverse surface of an information reading surface of a first substrate, (a) a plurality of photoelectric conversion elements and (b) a TCP (Tape Carrier Package) and/or an FPC (Flexible Printed Circuit), which is necessary for driving the plurality of photoelectric conversion elements; bonding a second substrate by an adhesive material to the first substrate so that the second substrate covers the plurality of photoelectric conversion elements on the reverse surface of the information reading surface of the first substrate; and processing the information readings surface of the first substrate by etching or grinding so as to reduce a thickness of the first substrate.

With this invention, it is possible to provide a manufacturing method of a photoelectric conversion apparatus that does not require the process of bonding the micro glass sheet and that is capable of preventing the yield of products from being lowered.

In the present invention, not only the plurality of photoelectric conversion elements, but also the TCP and/or the FPC, which is necessary for driving the plurality of photoelectric conversion elements, is installed on the reverse surface of the information reading surface of the first substrate.

Therefore, the TCP and/or FPC is formed on the reverse surface of the information reading surface. As a result, the information reading surface is a flat and smooth surface of the photoelectric conversion element formation substrate, and the protrusion of the installation portion of the semiconductor integrated circuit (IC), the TCP, and/or the FPC, for example, which has conventionally existed, is eliminated.

As a result, it is possible to provide a manufacturing method of a photoelectric conversion apparatus in which the protrusion of the installation portion toward the surface of the document is eliminated.

In the manufacturing method of the photoelectric conversion apparatus of the present invention, the first substrate is made of glass, and the grinding of the first substrate is chemical grinding in the step of processing. By using a glass substrate as the first substrate, it is possible to employ the chemical grinding in processing the reverse surface of the first substrate so as to reduce the thickness of the first substrate. In the chemical grinding, the thickness of the glass substrate is reduced by chemical erosion caused by soaking the first substrate in the solvent. This makes it possible to statically process the first substrate. Therefore, damages to products in a course of processing can be reduced, as compared, for example, with a case where the physical grinding is carried out.

As a result, it is possible to provide a manufacturing method of a photoelectric conversion apparatus that is capable of preventing the yield of products from being lowered.

INDUSTRIAL APPLICABILITY

The invention is applicable to, for example, an image sensor of a matrix-type image reading apparatus that is a close-touching-type photoelectric conversion apparatus capable of reading information of documents, photographs, business cards and the like, owing to such an arrangement that large numbers of photoelectric conversion means (e.g. photodiodes, phototransistors) and switching elements (e.g. thin film transistors) are disposed on a substrate in a line or two dimensionally in lines.

The invention claimed is:

1. A photoelectric conversion apparatus, comprising:
   a photoelectric conversion element formation substrate having, on a photoelectric conversion element formation surface thereof, a plurality of photoelectric conversion elements, the photoelectric conversion element formation surface being a reverse surface of an information reading surface;
   a supporting substrate bonded by an adhesive material to the photoelectric conversion element formation substrate so that the supporting substrate is integrated with the photoelectric conversion element formation substrate and faces the plurality of photoelectric conversion elements on the photoelectric conversion element formation substrate; and
   wherein both the photoelectric conversion elements and corresponding switching elements are provided on the photoelectric conversion element formation substrate.

2. The photoelectric conversion apparatus as set forth in claim 1, wherein: the supporting substrate is thicker than the photoelectric conversion element formation substrate.

3. The photoelectric conversion apparatus as set forth in claim 1, further comprising: a semiconductor integrated circuit in a peripheral portion of the photoelectric conversion element formation surface, the semiconductor integrated circuit being necessary for driving the plurality of photoelectric conversion elements.

4. The photoelectric conversion apparatus as set forth in claim 2, further comprising: a semiconductor integrated circuit in a peripheral portion of the photoelectric conversion element formation surface, the semiconductor integrated circuit being necessary for driving the plurality of photoelectric conversion elements.

5. The photoelectric conversion apparatus as set forth in claim 1, further comprising: a tape carrier package and/or a flexible printed circuit in a peripheral portion of the photoelectric conversion element formation surface, the tape carrier package and/or the flexible printed circuit being necessary for driving the plurality of photoelectric conversion elements.

6. The photoelectric conversion apparatus as set forth in claim 2, further comprising: a tape carrier package and/or a flexible printed circuit in a peripheral portion of the photoelectric conversion element formation surface, the tape carrier package and/or the flexible printed circuit being necessary for driving the plurality of photoelectric conversion elements.

7. The photoelectric conversion apparatus as set forth in claim 1, wherein:
   the plurality of photoelectric conversion elements include a semiconductor layer,
   the photoelectric conversion apparatus further comprising:
   a transparent section between the photoelectric conversion element formation substrate and the semiconductor layer.

8. The photoelectric conversion apparatus as set forth in claim 2, wherein:
   the plurality of photoelectric conversion elements include a semiconductor layer,
   the photoelectric conversion apparatus further comprising: a transparent section between the photoelectric conversion element formation substrate and the semiconductor layer.

9. A photoelectric conversion apparatus, comprising:
   a photoelectric conversion element formation substrate having, on a photoelectric conversion element formation surface thereof, a plurality of photoelectric conversion elements, the photoelectric conversion element formation surface being a reverse surface of an information reading surface;
   a supporting substrate bonded by an adhesive material to the photoelectric conversion element formation substrate so that the supporting substrate is integrated with the photoelectric conversion element formation substrate and faces the plurality of photoelectric conversion elements on the photoelectric conversion element formation substrate; and
   an X-ray-to-light conversion film, provided on the information reading surface of the photoelectric conversion element formation substrate, for converting an X-ray into light.

10. A photoelectric conversion apparatus, comprising:
    a photoelectric conversion element formation substrate having, on a photoelectric conversion element formation surface thereof, a plurality of photoelectric conversion elements, the photoelectric conversion element formation surface being a reverse surface of an information reading surface;
    a supporting substrate bonded by an adhesive material to the photoelectric conversion element formation substrate so that the supporting substrate is integrated with the photoelectric conversion element formation substrate and faces the plurality of photoelectric conversion elements on the photoelectric conversion element formation substrate;
    wherein the supporting substrate is thicker than the photoelectric conversion element formation substrate; and
    an X-ray-to-light conversion film, provided on the information reading surface of the photoelectric conversion element formation substrate, for converting an X-ray into light.

11. A photoelectric conversion apparatus, comprising:
a photoelectric conversion element formation substrate having, on a photoelectric conversion element formation surface thereof, a plurality of photoelectric conversion elements, the photoelectric conversion element formation surface being a reverse surface of an information reading surface;
a supporting substrate bonded by an adhesive material to the photoelectric conversion element formation substrate so that the supporting substrate is integrated with the photoelectric conversion element formation substrate and faces the plurality of photoelectric conversion elements on the photoelectric conversion element formation substrate;
a display medium between the photoelectric conversion element formation substrate and the supporting substrate; and
an active element on the photoelectric conversion element formation surface, for driving the display medium.

12. A photoelectric conversion apparatus, comprising:
a photoelectric conversion element formation substrate having, on a photoelectric conversion element formation surface thereof, a plurality of photoelectric conversion elements, the photoelectric conversion element formation surface being a reverse surface of an information reading surface;
a supporting substrate bonded by an adhesive material to the photoelectric conversion element formation substrate so that the supporting substrate is integrated with the photoelectric conversion element formation substrate and faces the plurality of photoelectric conversion elements on the photoelectric conversion element formation substrate;
wherein the supporting substrate is thicker than the photoelectric conversion element formation substrate;
a display medium provided between the photoelectric conversion element formation substrate and the supporting substrate; and
an active element on the photoelectric conversion element formation surface, for driving the display medium.

13. The photoelectric conversion apparatus as set forth in claim 11, wherein: the display medium is liquid crystal.

14. The photoelectric conversion apparatus as set forth in claim 12, wherein: the display medium is liquid crystal.

15. The photoelectric conversion apparatus as set forth in claim 13, wherein: a display mode of the liquid crystal does not require a polarizer.

16. The photoelectric conversion apparatus as set forth in claim 14, wherein: a display mode of the liquid crystal does not require a polarizer.

17. The photoelectric conversion apparatus as set forth in claim 13, further comprising:
a light source provided to one side with respect to the supporting substrate, while the photoelectric conversion element formation substrate is provided to the other side,
the light source being used as a light source for illuminating a photographic object while information is read, and as a display-use light source while the information is displayed.

18. The photoelectric conversion apparatus as set forth in claim 14, further comprising:
a light source provided to one side with respect to the supporting substrate, while the photoelectric conversion element formation substrate is provided on the other side,
the light source being used as a light source for illuminating a photographic object while information is read, and as a display-use light source while the information is displayed.

19. The photoelectric conversion apparatus as set forth in claim 11, wherein: the display medium is an electroluminescence element.

20. The photoelectric conversion apparatus as set forth in claim 12, wherein: the display medium is an electroluminescence element.

21. The photoelectric conversion apparatus as set forth in claim 19, wherein: the electroluminescence element is used as a light source for illuminating a photographic object while information is read, and as a light emitting element while the information is displayed.

22. The photoelectric conversion apparatus as set forth in claim 20, wherein: the electroluminescence element is used as a light source for illuminating a photographic object while information is read, and as a light emitting element while the information is displayed.

23. A manufacturing method of a photoelectric conversion apparatus for reading information, comprising the steps of:
forming, on a reverse side of an information reading surface of a first substrate, (a) a plurality of photoelectric conversion elements and (b) an active element for driving a display medium;
installing, on the reverse surface of the information reading surface of the first substrate, a semiconductor integrated circuit, which is necessary for driving the plurality of photoelectric conversion elements;
placing the reverse side of the information reading surface of the first substrate so as to be opposite to a color filter substrate, and sealing liquid crystal between the first substrate and the color filter substrate; and
processing the information reading surface of the first substrate by etching or grinding so as to reduce a thickness of the first substrate.

24. A manufacturing method of a photoelectric conversion apparatus for reading information, comprising the steps of:
forming, on a reverse side of an information reading surface of a first substrate, (a) a plurality of photoelectric conversion elements and (b) an active element for driving a display medium;
installing, on the reverse surface of the information reading surface of the first substrate, a tape carrier package and/or a flexible printed circuit, which is necessary for driving the plurality of photoelectric conversion elements;
placing the reverse side of the information reading surface of the first substrate so as to be opposite to a color filter substrate, and sealing liquid crystal between the first substrate and the color filter substrate; and
processing the information reading surface of the first substrate by etching and/or grinding so as to reduce a thickness of the first substrate.

25. The manufacturing method of the photoelectric conversion apparatus as set forth in claim 23, wherein:
the first substrate is made of glass; and
the grinding of the first substrate is chemical grinding in the step of processing.

26. The manufacturing method of the photoelectric conversion apparatus as set forth in claim 24, wherein: the first substrate is made of glass; and the grinding of the first substrate is chemical grinding in the step of processing.

* * * * *